United States Patent
Mallett et al.

(10) Patent No.: US 10,537,016 B2
(45) Date of Patent: Jan. 14, 2020

(54) HIGH-CURRENT PCB TRACES

(71) Applicant: Schweitzer Engineering Laboratories, Inc., Pullman, WA (US)

(72) Inventors: Travis C. Mallett, Pullman, WA (US); Ben M. Armstrong, Pullman, WA (US); Forrest A. Rahrer, Palouse, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 91 days.

(21) Appl. No.: 15/491,727

(22) Filed: Apr. 19, 2017

(65) Prior Publication Data
US 2017/0311440 A1 Oct. 26, 2017

Related U.S. Application Data

(60) Provisional application No. 62/325,376, filed on Apr. 20, 2016.

(51) Int. Cl.
*H05K 1/02* (2006.01)
*H05K 1/11* (2006.01)
*H05K 3/40* (2006.01)

(52) U.S. Cl.
CPC ......... *H05K 1/0265* (2013.01); *H05K 1/0206* (2013.01); *H05K 2201/09572* (2013.01)

(58) Field of Classification Search
CPC ..... H05K 1/0265; H05K 1/0206; H05K 3/429
See application file for complete search history.

(56) References Cited

U.S. PATENT DOCUMENTS

| 5,451,720 | A | 9/1995 | Estes |
| 5,764,485 | A | 6/1998 | Lebaschi |
| 7,257,787 | B2 | 8/2007 | Lin |
| 8,464,200 | B1 | 6/2013 | Christo |
| 2013/0215586 | A1* | 8/2013 | Furusawa ............ H05K 1/0206 361/767 |
| 2016/0093431 | A1* | 3/2016 | Quilici ...................... H01F 5/00 336/200 |
| 2017/0194419 | A1* | 7/2017 | Lee ........................ H01L 27/016 |

OTHER PUBLICATIONS

Codreanu, Norocel D., Radu Bunea, and Paul Svasta. "Advanced investigations on PCB traces fusing in high power applications." Design and Technology in Electronic Packaging (SIITME), 2010 IEEE 16th International Symposium for. IEEE, 2010.

(Continued)

*Primary Examiner* — Timothy J Thompson
*Assistant Examiner* — Amol H Patel
(74) *Attorney, Agent, or Firm* — Jared L. Cherry

(57) ABSTRACT

The present disclosure relates to systems and methods using thermal vias to increase the current-carrying capacity of conductive traces on a multilayered printed circuit board (PCB). In various embodiments, parameters associated with vias may be selected to control various electrical and thermal properties of the conductive trace. Such parameters include the via diameter, a plating thickness, a number of vias, a placement of the vias, an amount of conductive material to be added or removed from the conductive trace, a change in the resistance of the conductive trace, a change in a fusing measurement of the conductive trace, and the like.

12 Claims, 20 Drawing Sheets

(56) References Cited

OTHER PUBLICATIONS

Rowlands, Michael J., and Vara Calmidi. "An Experimental and Computational Study of the Current Carrying capacity of High Performance PWB Interconnections." Endicott Interconnect Technologies. Sep. 2008.

Li, Liang. "Computation of power plane pair inductance, measurement of multiple switching current components and switching current measurement for multiple ICs with an island structure." 2012.

Brooks, Doug and Dave Graves. "Current Carrying Capacity of Vias: Some Conceptual Observations." Jan. 2003. http://www.ultracad.com/articles/viacurrents.pdf.

V. Calmidi and I. Memis, "Joule heating effects on the current carrying capacity of an organic substrate for flip-chip applications," Electronic Components and Technology Conference, 2009. ECTC 2009. 59th, San Diego, CA, 2009, pp. 1769-1774.

Cupertino, Francesco, and S. Ettorre. "Experimental evaluation of current carrying capacity of printed circuit stator coils." Industrial Electronics Society, IECON 2013—39th Annual Conference of the IEEE. IEEE, 2013.

Huang, Hui-Fen, Qing-Xin Chu, and Jian-Kang Xiao. "Fractal power network based on plant vein for power integrity." IEEE transactions on electromagnetic compatibility 52.3 (2010): 759-762.

Chen, Hsiao-Chung, and Ying-Wen Bal "Improvement of high current density PCB design on a high end server system." Industrial Electronics (ISIE), 2013 IEEE International Symposium on. IEEE, 2013.

Coppola, Luisa, Roland Schmidt, and Didier Cottet. "Investigation on Via Arrangements for the Thermal Management of High Current PCBs." 2009 Twenty-Fourth Annual IEEE Applied Power Electronics Conference and Exposition. 2009.

Halford, Chris. "IR-Drop Analysis: Can your PCB traces and planes 'handle' your power supply requirements?IR-Drop analysis ensures that they can." Mar. 2009. http://www.alspcb.com/pdfs/IRDrop.pdf.

Adam, Johannes. "New correlations between electrical current and temperature rise in PCB traces." Semiconductor Thermal Measurement and Management Symposium, 2004. Twentieth Annual IEEE. IEEE, 2004.

Ling, Yun. "On current carrying capacities of PCB traces." Electronic Components and Technology Conference, 2002. Proceedings. 52nd. IEEE, 2002.

Shankaran, Gokul V., M. Baris Dogruoz, and Daniel Dearaujo. "Orthotropic thermal conductivity and Joule heating effects on the temperature distribution of printed circuit boards." Thermal and Thermomechanical Phenomena in Electronic Systems (ITherm), 2010 12th IEEE Intersociety Conference on. IEEE, 2010.

Abou-Alfotouh, Ahmed, Mohamed Orabi, and Ali Ghahary. "PCB layout vias effect on power supply Derformance." Applied Power Electronics Conference and Exposition, 2008. APEC 2008. Twenty-Third Annual IEEE. IEEE, 2008.

Lemczyk, T. F., et al. "PCB trace thermal analysis and effective conductivity." Journal of Electronic Packaging 114.4 (1992): 413-419.

Bunea, Radu, et al. "PCB tracks thermal simulation, analysis and comparison to IPC-2152 for electrical current carrying capacity." Electronic System-Integration Technology Conference (ESTC), 2010 3rd. IEEE, 2010.

Widener, Steve. "Spreadsheet modeling tool helps analyze power- and ground-plane voltage drops to keep core voltages within tolerance." 2007. http://www.ti.com/lit/an/slyt273/slyt273.pdf.

Smith, Larry D., Raymond Anderson, and Tanmoy Roy. "Power plane Spice models and simulated performance for materials and geometries." Advanced Packaging, IEEE Transactions on 24.3 (2001): 277-287.

Dogruoz, Mehmet Baris, and Gokul Shankaran. "Spatial variation of temperature on printed circuit boards: Effects of anisotropic thermal conductivity and Joule heating." Components, Packaging and Manufacturing Technology, IEEE Transactions on 2.10 (2012): 1649-1658.

Wang, YI, S. W. H. De Haan, and J. A. Ferreira. "Thermal Design Guideline of PCB traces under DC and AC Current" Energy Conversion Congress and Exposition, 2009. ECCE 2009. IEEE. IEEE, 2009.

Electrical Engineering Stack Exchange "PCB Design—Does a trace with via handle more power?" Oct. 2015. http://electronics.stackexchange.com/questions/194333/doesatracewithviahandlemorepower.

Cree, Inc. "Optimizing PCB Thermal Performance for Cree Xlamp LEDs." Product Design Guide 2015 www.cree.com.

\* cited by examiner

HIGH-CURRENT PCB TRACES

RELATED APPLICATIONS

This application claims the benefit under 35 U.S.C. § 119(e) of U.S. Provisional Patent Application No. 62/325,376, filed Apr. 20, 2016, and titled "HIGH-CURRENT PCB TRACES," which is incorporated herein by reference in their entireties.

TECHNICAL FIELD

The present disclosure relates to systems and methods using thermal vias to increase the current-carrying capacity of a conductive trace on a multilayered printed circuit board (PCB). More specifically, but not exclusively, the present disclosure may be implemented by creating thermal vias through a plurality of layers of high current-carrying PCB traces and selecting the parameters of such vias to control electrical and/or thermal characteristics of the conductive trace.

BRIEF DESCRIPTION OF THE DRAWINGS

Non-limiting and non-exhaustive embodiments of the disclosure are described, including various embodiments of the disclosure with reference to the figures included in the detailed description.

DETAILED DESCRIPTION

Figure 1:
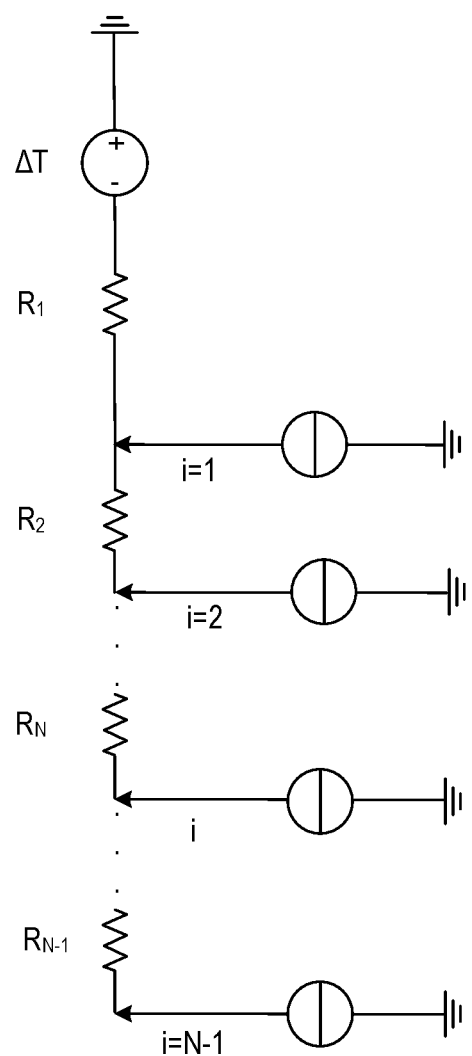
FIG. 1 illustrates a thermal network of a layered PCB consistent with the present disclosure.

The present disclosure pertains to systems and methods for improving various characteristics of high-current PCB traces using thermal vias. In various embodiments, improvement in characteristics such as current carrying capacity (CCC), solderability, and heat dissipation may be realized by providing a plurality of vias in the trace. In various embodiments, vias may equalize the temperature between layers, increase the amount of conductive material in the trace, decrease the trace resistance, and/or improve the solderability of the trace. All of the foregoing characteristics offer improvements in CCC. Additionally, the present disclosure presents techniques for analyzing and designing changes in trace resistance due to vias.

A variety of characteristics and parameters of vias may be selected to achieve a desired electrical or thermal response of a conductive trace consistent with the present disclosure. Such parameters and characteristics include the via diameter, a plating thickness, a number of vias, a placement of the vias, an amount of conductive material to be added or removed from the conductive trace, a change in the resistance of the conductive trace, a change in a fusing measurement of the conductive trace, and the like.

The systems and methods disclosed herein may be applied in a variety of applications. One specific application may pertain to equipment used to monitor and control electrical power systems. Modern electrical power delivery systems may be monitored, controlled, automated, and/or protected using intelligent electronic devices (IEDs). IEDs may be used to monitor equipment of many types, including electric transmission lines, electric distribution lines, current transformers, busses, switches, circuit breakers, and a variety of other types of electrical power system infrastructure. Events within electrical power systems (e.g., an overcurrent event resulting from a fault) may cause electrical spikes. Such spikes may be transferred to the IEDs monitoring affected equipment. In some applications, protective relays may be required to withstand current flows of up to 100 times the current flow associated with typical operation for a period of time. In some cases, IEDs may be designed to monitor a nominal current of 5 amperes. During certain events, the current may increase to 500 amperes, requiring the design of such IEDs to provide a CCC of at least 500 amperes for a period of time (e.g., 1 second). This level of current flow may generate substantial heating. The resulting heat, if not dissipated sufficiently, may cause thermal damage or malfunction. Various embodiments consistent with the present disclosure may improve heat dissipation. In addition to applications related to equipment for monitoring electrical power systems, the systems and methods disclosed herein may be applied in any application involving high-current PCB traces.

In some embodiments, the techniques disclosed herein may also improve the ability to solder connections into high-current traces. Large PCB traces may be act as heat sinks at the solder points. As a result, connectors may not solder well into a large current-carrying trace. This can be detrimental for the CCC of the trace, as insufficient solder may significantly increase resistance, heating, and otherwise the general current withstand of the trace. The techniques disclosed herein may improve the solderability of large PCB traces.

The CCC of a PCB trace is affected by a variety of parameters, including the physical dimensions of the trace, the electrical resistance of the trace, and the ability to dissipate heat. The CCC of a PCB may be increased by increasing the physical dimensions of the trace, and thereby increasing the amount of conductive material in the trace. In various applications, however, the available space may be constrained. Space constraints may be partially addressed by using a smaller trace on a plurality of layers; however, this approach may be limited by the thermal performance of the design. In addition, the flow of electrical current through the trace generates heat proportional to the resistance of the trace. Accordingly, reduction in the electrical resistance of the trace results in reduced heat generation and reduced power loss, and therefore, improves CCC. Smaller traces tend to exhibit higher resistance, and therefore, greater heating. The CCC of a multi-layer trace may be limited based on thermal performance.

FIG. 1 illustrates a thermal network of a layered PCB consistent with the present disclosure. The layers may exhibit different thermal responses owing to one or more of the differences in thermal resistance associated with the layer, the heat dissipation capacity of each layer, and differences in layer thickness associated with each layer. The heat dissipation capacity may be affected by various factors, including proximity to a cooling system. In some embodiments, particular those used in rugged or high-dependability applications, cooling may be achieved passively (e.g., by air flow). The heat dissipation from the lowest layers may be less than the heat dissipation from the higher levels. Accordingly, the thermal performance of the layer that has the lowest heat dissipation may limit the overall CCC. Improving thermal equalization among layers using the techniques disclosed herein may reduce the disparity between layers, and thus, may allow for a greater overall CCC.

In various embodiments consistent with the present disclosure, a plurality of vias may be used to reduce the thermal resistances (i.e., $R_{N-1}$, $R_n$, $R_2$, $R_1$), between layers. As may be appreciated, reducing the value of the thermal resistances prevents the innermost layer from becoming significantly hotter than the other layers.

Figure 2:
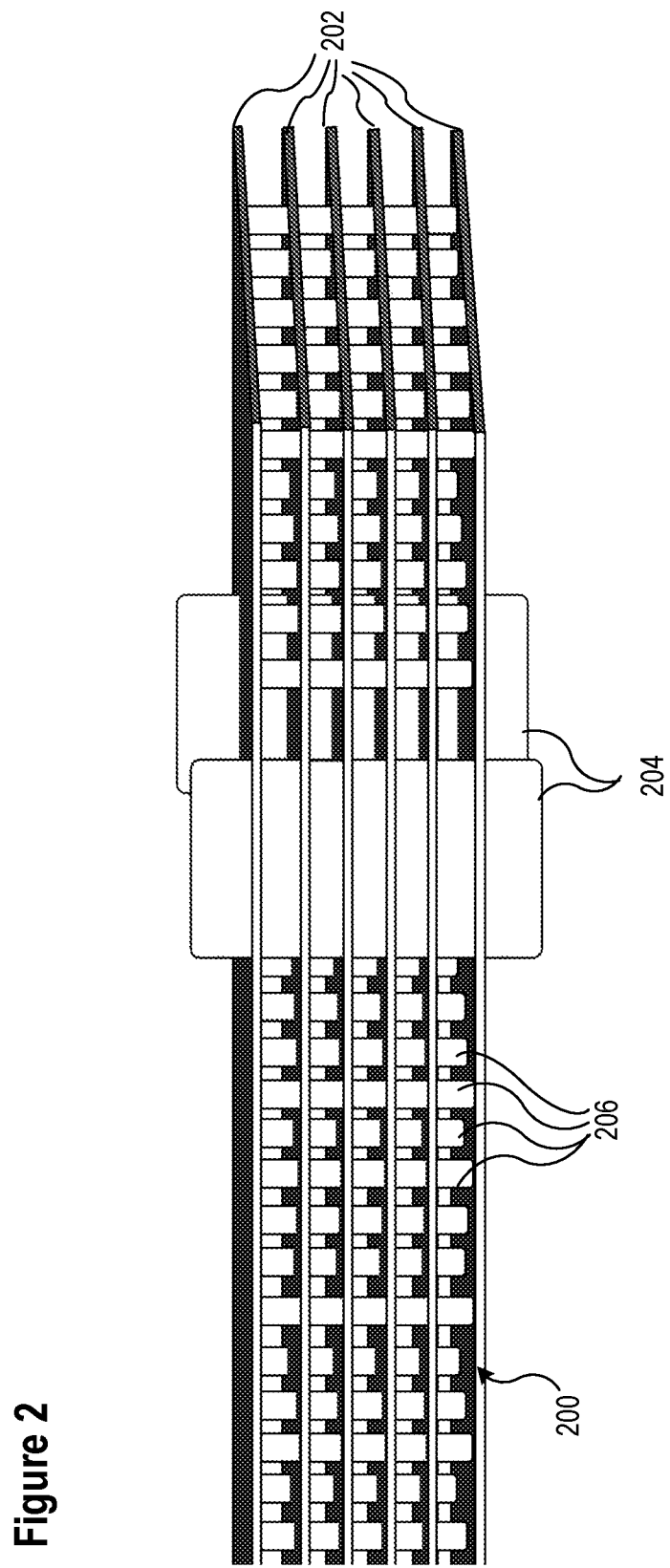
FIG. 2 illustrates a trace comprising a plurality of layers and comprising a plurality of vias disposed between the layers consistent with the present disclosure.

FIG. 2 illustrates a trace 200 comprising a plurality of layers 202 and comprising a plurality of vias 206 disposed between the layers 202 consistent with the present disclosure. Current ports 204 are in connection with each layer 202 of the multilayer trace 200. The large number of vias 206 disposed between the layers may provide several desirable characteristics, including: increasing the CCC of the trace 200, decreasing the resistance of the trace 200, improving thermal equalization among the plurality of layers 202, and improving the solderability of the trace 200.

The electrical and thermal performance of trace 200 may be affected by the size of the vias. Accordingly, a hole size may be selected in designing trace 200 to improve the CCC of trace 200 for a specific application. In selecting a hole size, the following considerations may be implicated:
1. The conductive material removed by the via drilling procedure. The size of the hole may be selected to ensure that conductive material added by the via is greater than, or equal to the amount of copper removed by the drilling procedure used to create the vias.

2. The effect of the hole size on the electrical resistance. As described in greater detail below, the size of the hole impacts the resistance of the trace. In general, the hole increases the resistance in the plane of the trace; however, a via barrel (as opposed to a simple hole in the plane) may provide a current path that has a lower resistance.

3. The placement of the vias. In various embodiments, the vias may be placed throughout the trace or may be concentrated around connector ports to improve solderability due to improved heat conduction between the layers 202.

Figure 3A:
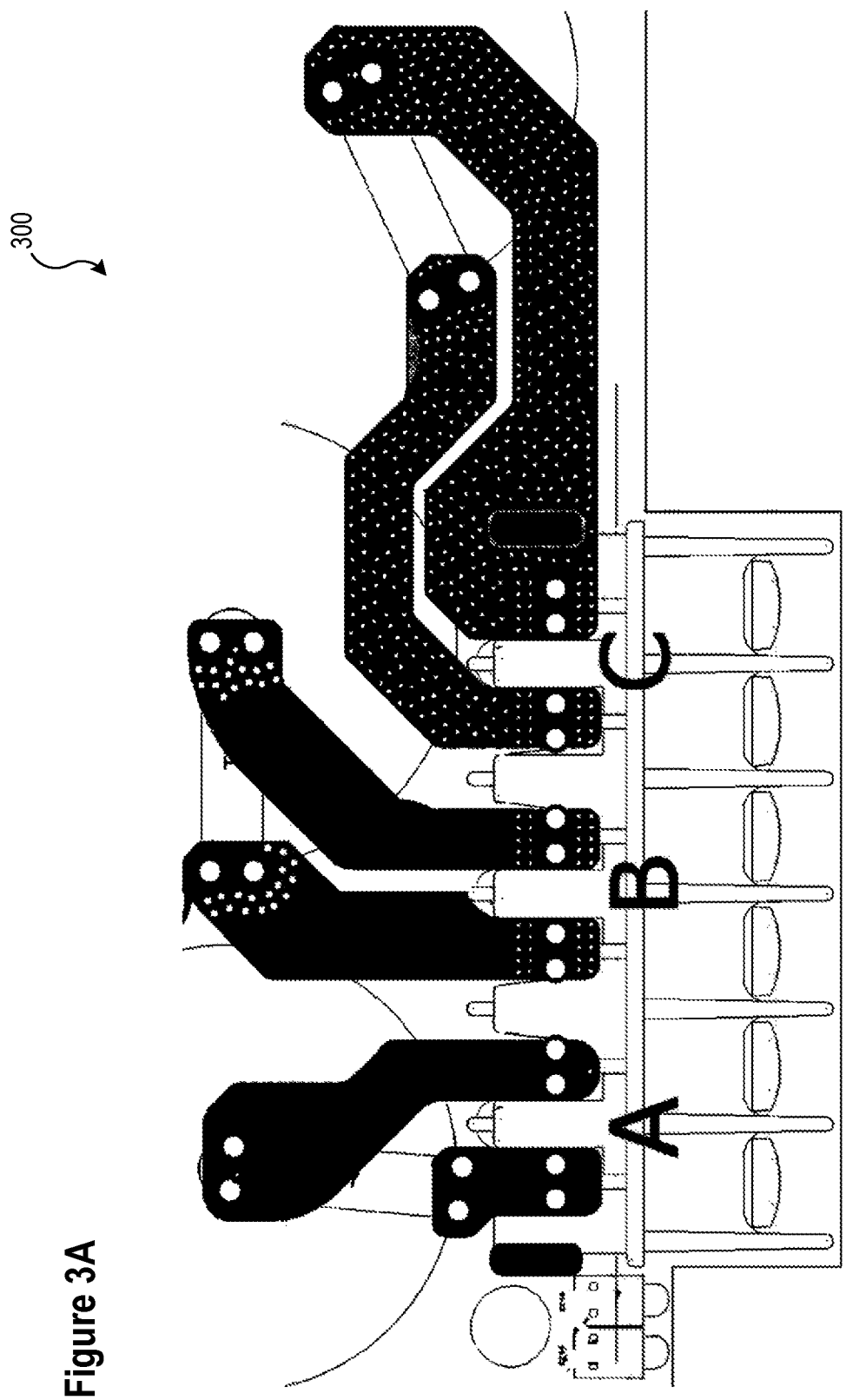
FIG. 3A illustrates a diagram of a first PCB including three different patterns of high-current traces consistent with embodiments of the present disclosure.

FIG. 3A illustrates a diagram of a first PCB 300 including three different patterns of high-current traces consistent with embodiments of the present disclosure. As illustrated, Channel C is populated with vias along its length, and Channel A does not include any vias. Channel B contains vias around the solder points, which may improve solderability. The prototype comprises a 12-layer board contained within a 62 mil thickness using 0.5 oz. of copper. The high-current traces are duplicated on each layer. Experimental testing of PCB 300 showed that all of the traces passed testing of an electrical current of 500 A for 1 second. Channel C exhibited the best solderability.

Figure 3B:
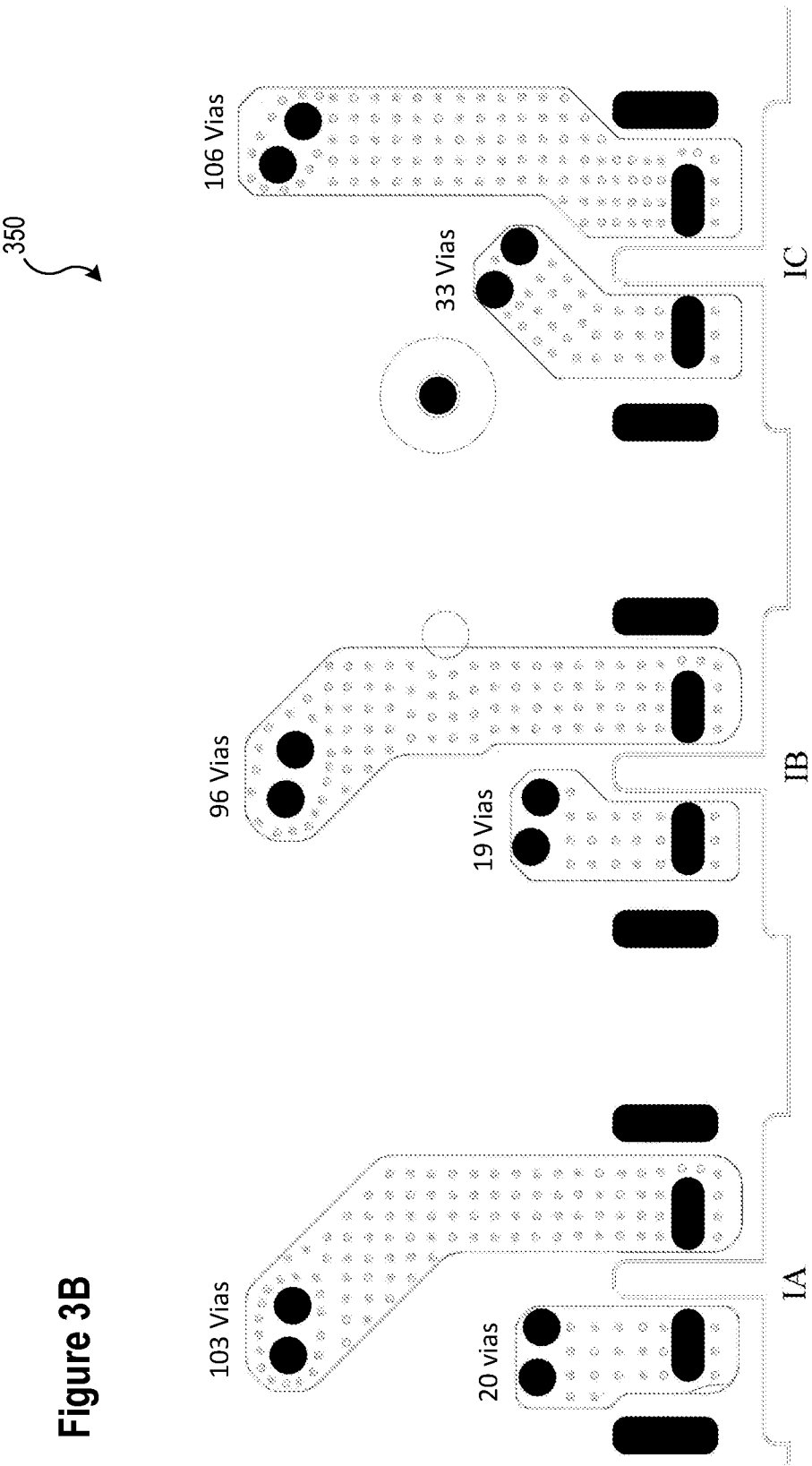
FIG. 3B illustrates a second PCB including three different patterns of high-current traces having different numbers of vias consistent with embodiments of the present disclosure.

FIG. 3B illustrates a second PCB 350 including three different patterns of high-current traces having different numbers of vias consistent with embodiments of the present disclosure. Each channel on PCB 350 includes a different number of vias. As described above in connection with FIG. 3A, the vias may be disposed around solder points to improve solderability and disposed along a length of the channels to improve the thermal performance of PCB 350.

Figure 4:
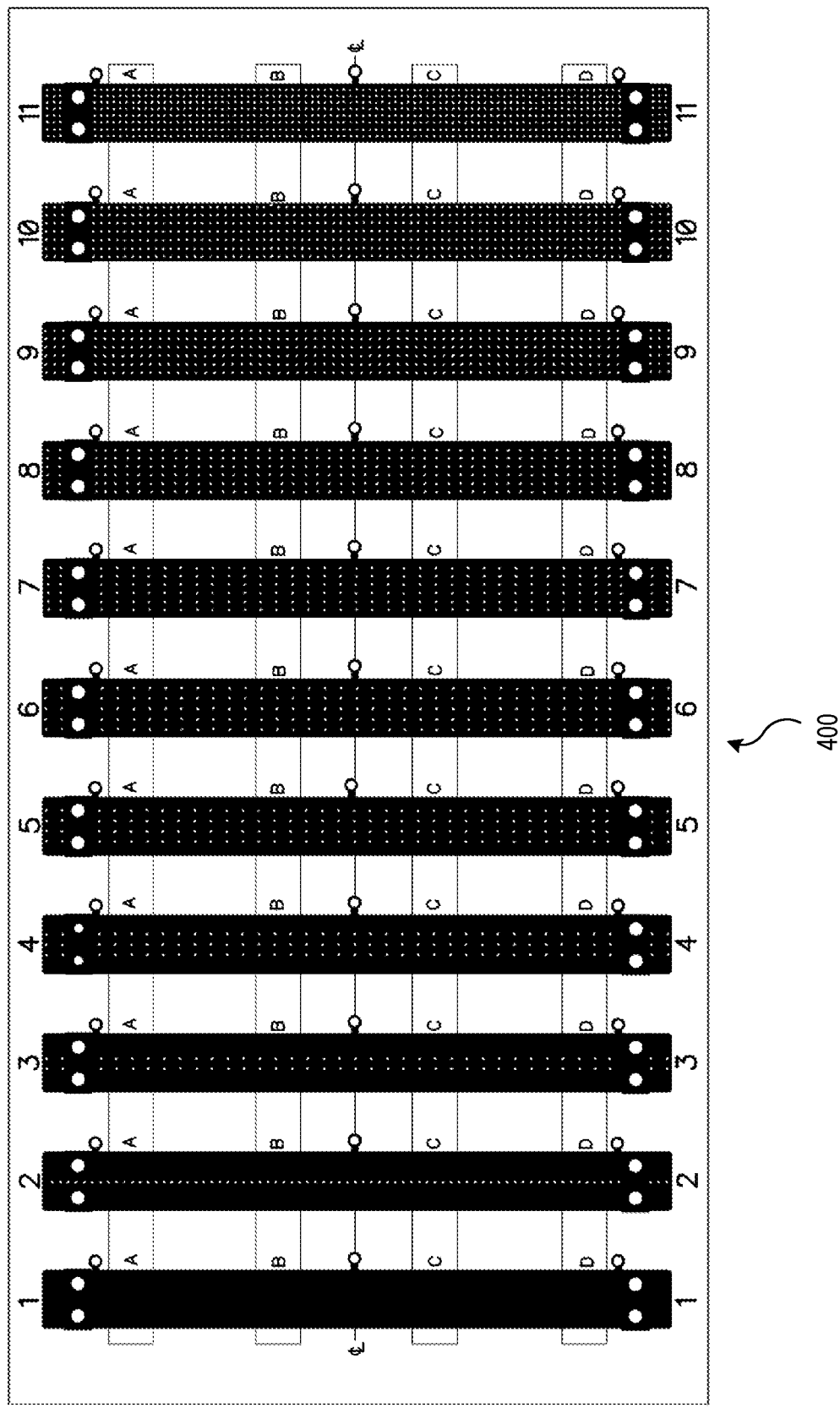
FIG. 4 illustrates a diagram of a second prototype PCB including 11 high-current traces having a varying number and density of vias consistent with the present disclosure.

FIG. 4 illustrates a diagram of a second prototype PCB 400 including 11 high-current traces having a varying number and density of vias and consistent with the present disclosure. PCB 400 has the following specifications:
Trace length: 2.39 in. between connectors.
Trace width: 0.25 in.
Number of layers: 6.
Copper weight: 1 oz.
Total thickness of all copper layers: 10.5 mil.
Board Thickness: 62 mil
Via Diameter: 13 mil.
Via Plating Thickness: 1 mil typical, 0.8 mil minimum The experimental results for PCB 400 may also be verified using the foregoing parameters in a simulation.

Figure 5:
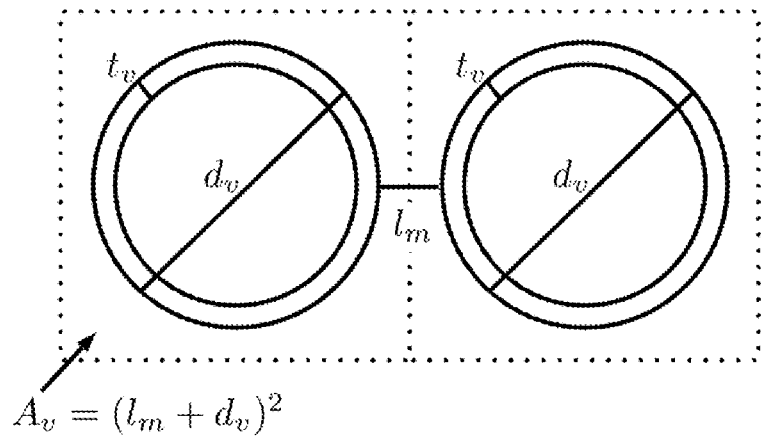
FIG. 5 illustrates variables representing a separation between adjacent vias, the diameter of the vias, and the wall thickness of the vias consistent with embodiments of the present disclosure.
Figure 6:
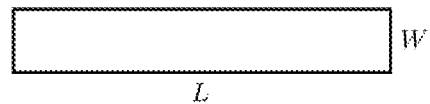
FIG. 6 illustrates variables representing a length and width of a current-carrying trace consistent with embodiments of the present disclosure.
Figure 7:
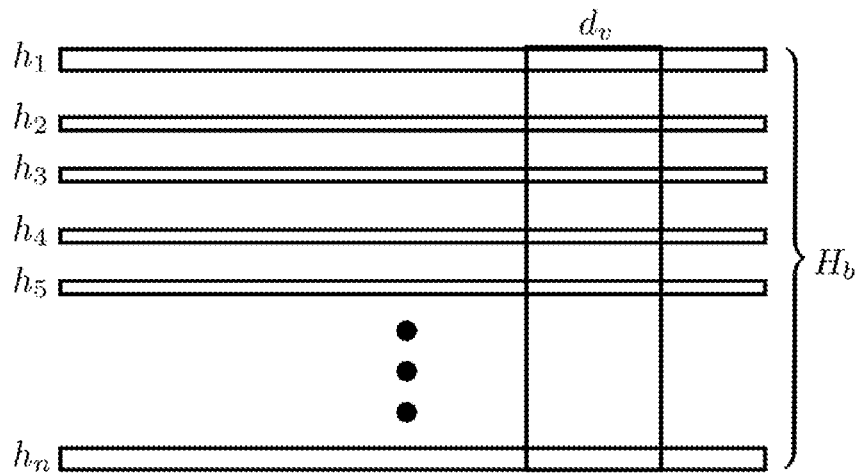
FIG. 7 illustrates variables representing the total conductive material in a current-carrying trace consistent with the present disclosure.

FIGS. 5, 6, and 7 illustrate various parameters that may be related to determination of the change in conductive material in a conductive trace. FIG. 5 illustrates variables representing a separation between adjacent vias, the diameter of the vias, and the wall thickness of the vias consistent with embodiments of the present disclosure. FIG. 6 illustrates variables representing a length and width of a current-carrying trace consistent with embodiments of the present disclosure. FIG. 7 illustrates variables representing the total conductive material, $H_c$, in a current-carrying trace consistent with the present disclosure.

As illustrated in FIG. 5, a keep-out area, $A_v$, associated with each via may be represented as a function of the minimum space between two adjacent vias and the diameter of the vias $d_v$. For the conductive trace shown in FIG. 6, having a width W and a length L, the maximum number of vias, $n_{max}$, is given by Eq. 1.

$$n_{max} = \frac{L \cdot W}{(l_m + d_v)^2} \qquad \text{Eq. 1}$$

Although FIG. 6 illustrates a rectangular conductive trace, the teachings of the present disclosure may be applied to conductive traces of any geometry such as is illustrated in FIG. 3. A net change in the copper volume of the trace may also be determined. The amount of conductive material removed by the drilling procedure, $V_{c-}$, may be determined using Eq. 2.

$$V_{c-} = \pi \left(\frac{d_v}{2}\right)^2 \cdot H_c \qquad \text{Eq. 2}$$

After the hole is drilled, conductive material is plated on the inside of the via hole with a thickness $t_v$. The plating adds additional conductive material in the form of a hollow cylinder with a height extending the entire thickness of the board. The added conductive material, $V_{c+}$, may be calculated using Eq. 3.

Volume of Outer Cylinder Volume of Inner Cylinder $$V_{c+} = \pi \left(\frac{d_v}{2}\right)^2 \cdot H_b - \pi \left(\frac{d_v - 2t_v}{2}\right)^2 \cdot H_b \qquad \text{Eq. 3}$$

Eq. 3 may be alternatively expressed in Eq. 4.

$$V_{c+} = \pi \left[\left(\frac{d_v}{2}\right)^2 - \left(\frac{d_v - 2t_v}{2}\right)^2\right] \cdot H_b \qquad \text{Eq. 4}$$

The net change in conductive material for a single via, $V_{c,(1via)}$, may be determined using Eq. 5.

$$V_{c,(1via)} = V_{c+} - V_{c-} \qquad \text{Eq. 5}$$

If a via results in a net increase in conductive material, it may be advantageous in certain applications to maximize the number of vias. The total conductive material that may be added for vias having a minimal spacing may be determined using Eq. 5 and Eq. 1, as shown in Eq. 6.

$$V_c = V_{c,(1via)} \cdot \frac{LW}{(l_m + d_v)^2} \qquad \text{Eq. 6}$$

A percent increase in the total conductive material may be determined using Eq. 7.

$$\frac{\% \, ChangeinCopper}{100} = \frac{V_c + WLH_c}{WLH_c} \qquad \text{Eq. 7}$$

Eq. 7 may be combined and simplified, as expressed in Eq. 8, in a form that is not a function of the trace dimensions.

$$\frac{\% \, ChangeinCopper}{100} = \qquad \text{Eq. 8}$$

-continued
$$\frac{4H_c l_m^2 - d_v^2 H_c(\pi - 4) - 4H_b \pi t_v^2 + 4d_v(2H_c l_m + H_b \pi t_v)}{4H_c(d_v + l_m)^2}$$

Figure 8:
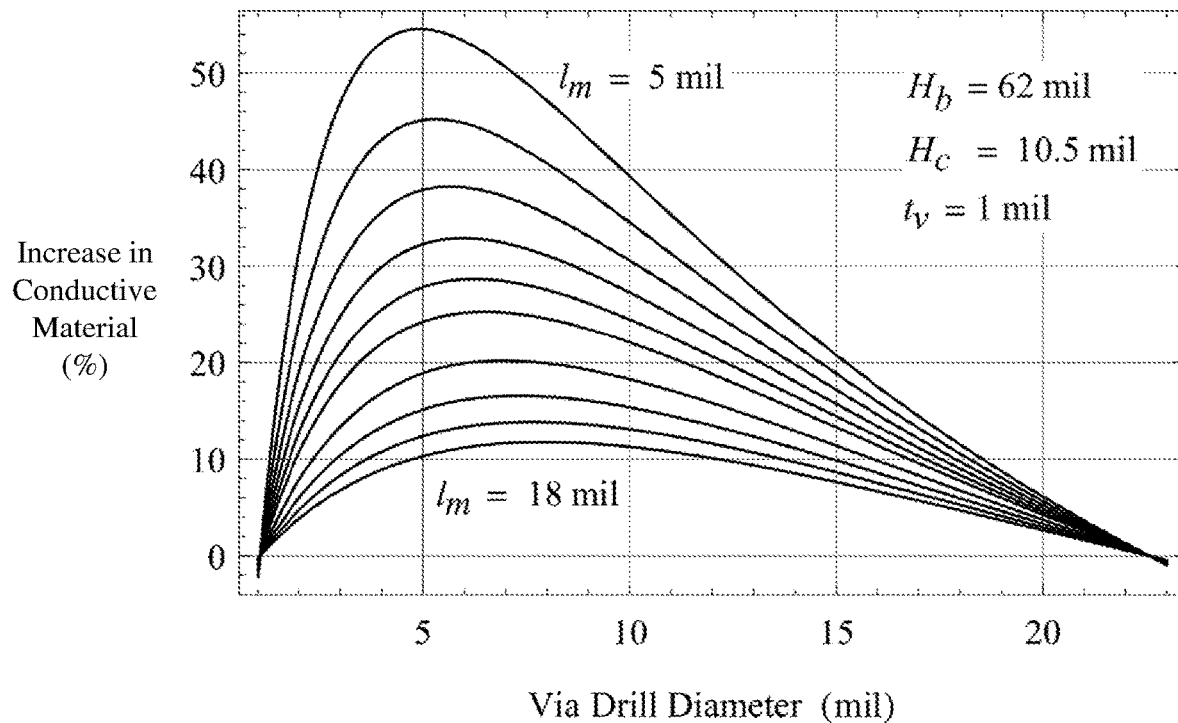
FIG. 8 illustrates a plot of an increase in conductive material as a function of via drill diameters for a variety of minimum spacing values between vias consistent with embodiments of the present disclosure.

FIG. 8 illustrates a plot of an increase in conductive material as a function of via drill diameters for a variety of minimum spacing values between vias consistent with embodiments of the present disclosure. In the illustrated plot, the values of $l_m$ are, from top to bottom, 5, 6, 7, 8, 9, 10, 12, 14, 16, and 18 mil. For a 62 mil thick PCB with 10.5 mil of combined copper across the layers, and 1 mil of via wall plating thickness, the percent of additional copper increases as the via density increases (i.e., as $l_m$ decreases).

The value of the optimal drill size may be calculated by taking the partial derivative of Eq. 8, which is shown in Eq. 9.

$$d_{v(best)} = \frac{2(H_b l_m t_v + 2H_b t_v^2)}{H_c l_m + 2H_b t_v} \qquad \text{Eq. 9}$$

Eq. 9 may be plotted versus plating thickness for various values of $l_m$.

Figure 9:
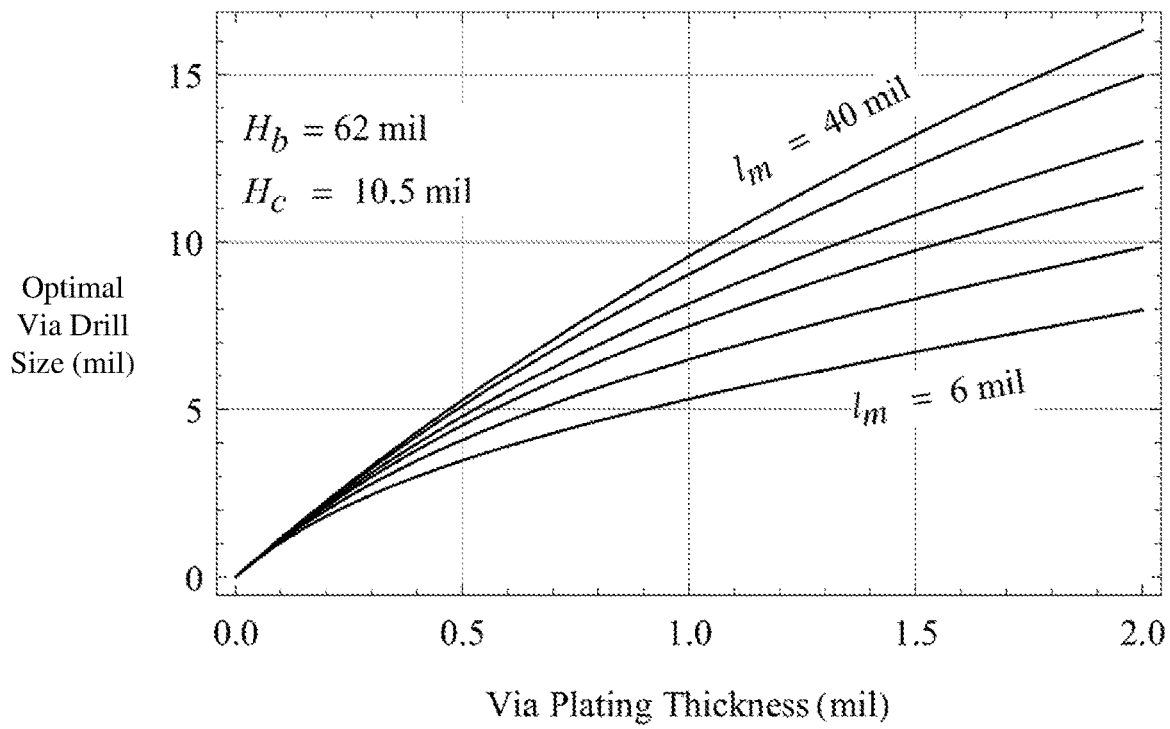
FIG. 9 illustrates a plot of an optimal via drill size as a function of via plating thickness for a plurality of minimum spacing values between vias consistent with embodiments of the present disclosure.

FIG. 9 illustrates a plot of an optimal via drill size as a function of via plating thickness for a plurality of minimum spacing values between vias consistent with embodiments of the present disclosure. In the illustrated plot, the values of $l_m$ are, from top to bottom, 40, 30, 20, 15, 10, and 6 mil. In various embodiments, manufacturing considerations or other issues (e.g., a limited number of drill sizes) may limit various design parameters, such as via diameter. Such constraints may be addressed in various embodiments by making appropriate adjustments to other parameters (e.g., a plating thickness). In one specific example, a drill size of 5 mil may be desired to maximize the increase of conductive material. See FIG. 8. If a 5 mil drill size is not available, the via plating thickness may be adjusted to place the optimal drill size within an accessible window. With reference to FIG. 9, a plating thickness of about 1.5 mil corresponds to an optimal drill size of approximately 13 mil for maximum addition of conductive material. Varying combinations of drill size, spacing, and/or density may be used to achieve a desired result (e.g., maximizing an increase in conductive material, decreasing resistance, etc.).

Figure 10:
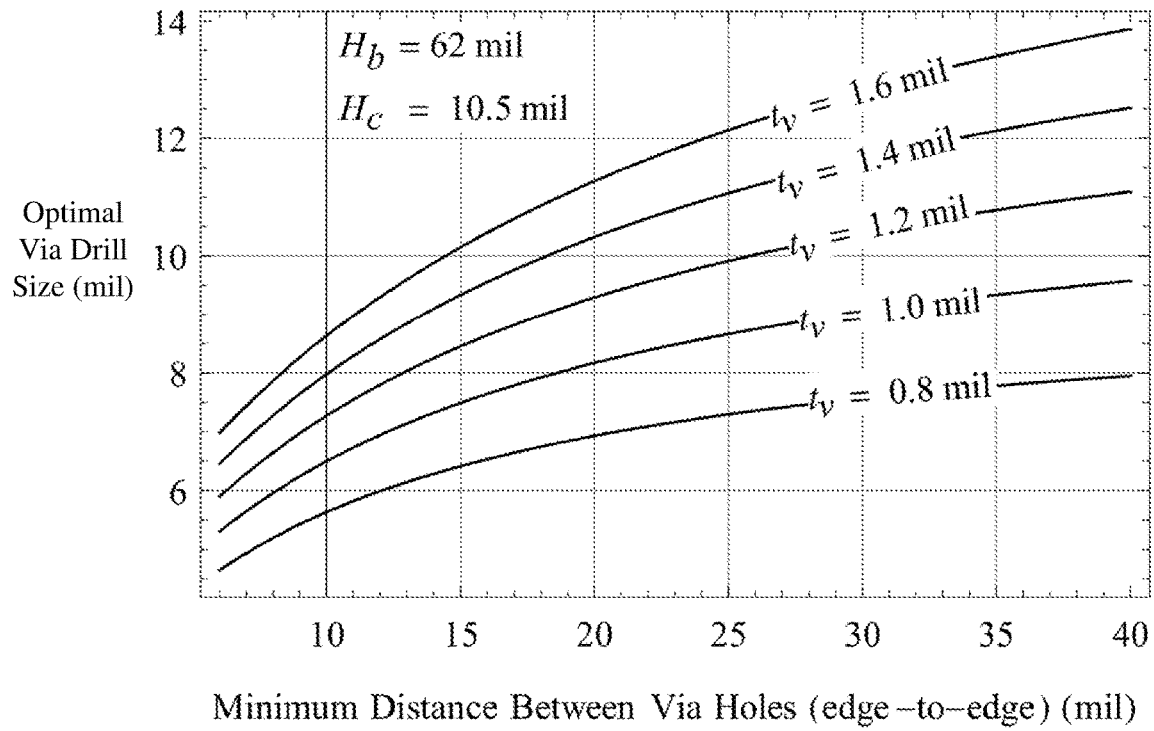
FIG. 10 illustrates a plot of an optimal via drill size versus the minimum spacing between vias for a plurality of values of via plating thicknesses consistent with embodiments of the present disclosure.

FIG. 10 illustrates a plot of an optimal via drill size versus the minimum spacing between vias for a plurality of values of via plating thicknesses, $t_v$, consistent with embodiments of the present disclosure.

Figure 11:
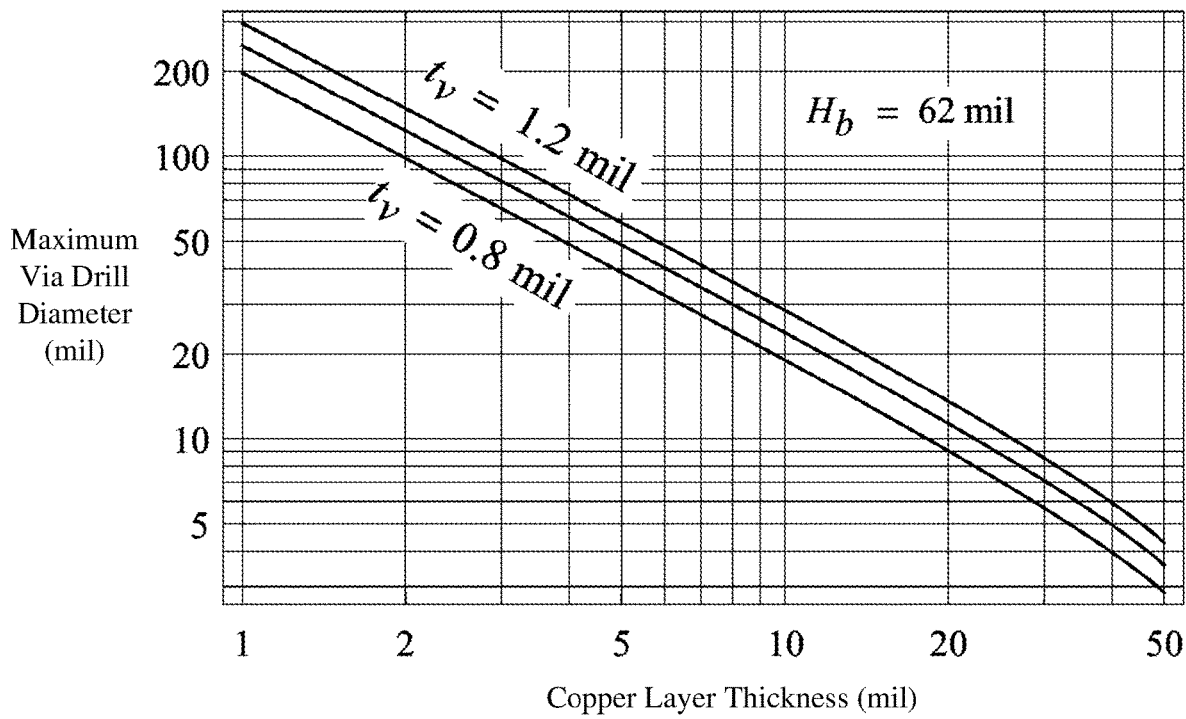
FIG. 11 illustrates a plot of a maximum via drill diameter as a function of copper layer thickness for a plurality of via plating thicknesses consistent with embodiments of the present disclosure.

FIG. 11 illustrates a plot of a maximum via drill diameter as a function of copper layer thickness for a plurality of via plating thicknesses, $t_v$, consistent with embodiments of the present disclosure. In the illustrated plot, the values of $t_v$ are, from top to bottom, 1.2, 1.0, and 0.8 mil.

As the size of the drill increases above the optimal value, more copper is removed by the drilling process than is added by the plating process, as shown in FIG. 8. Further, the limits of via drill size for a given set of geometric conditions may be determined using Equation 5. The results of setting Equation 5 greater than zero and solving for $d_v$, are shown in Eqs. 10-12. Eq. 11 is plotted in FIG. 12.

$$V_{c,(1via)} > 0 \qquad \text{Eq. 10}$$

-continued
$$d_v < \frac{2H_b t_v}{H_c} + 2\sqrt{-\frac{H_b^2 t_v^2 + H_b H_c t_v^2}{H_c^2}} \qquad \text{Eq. 11}$$

$$d_v > \frac{2H_b t_v}{H_c} - 2\sqrt{-\frac{H_b^2 t_v^2 + H_b H_c t_v^2}{H_c^2}} \qquad \text{Eq. 12}$$

Figure 12:
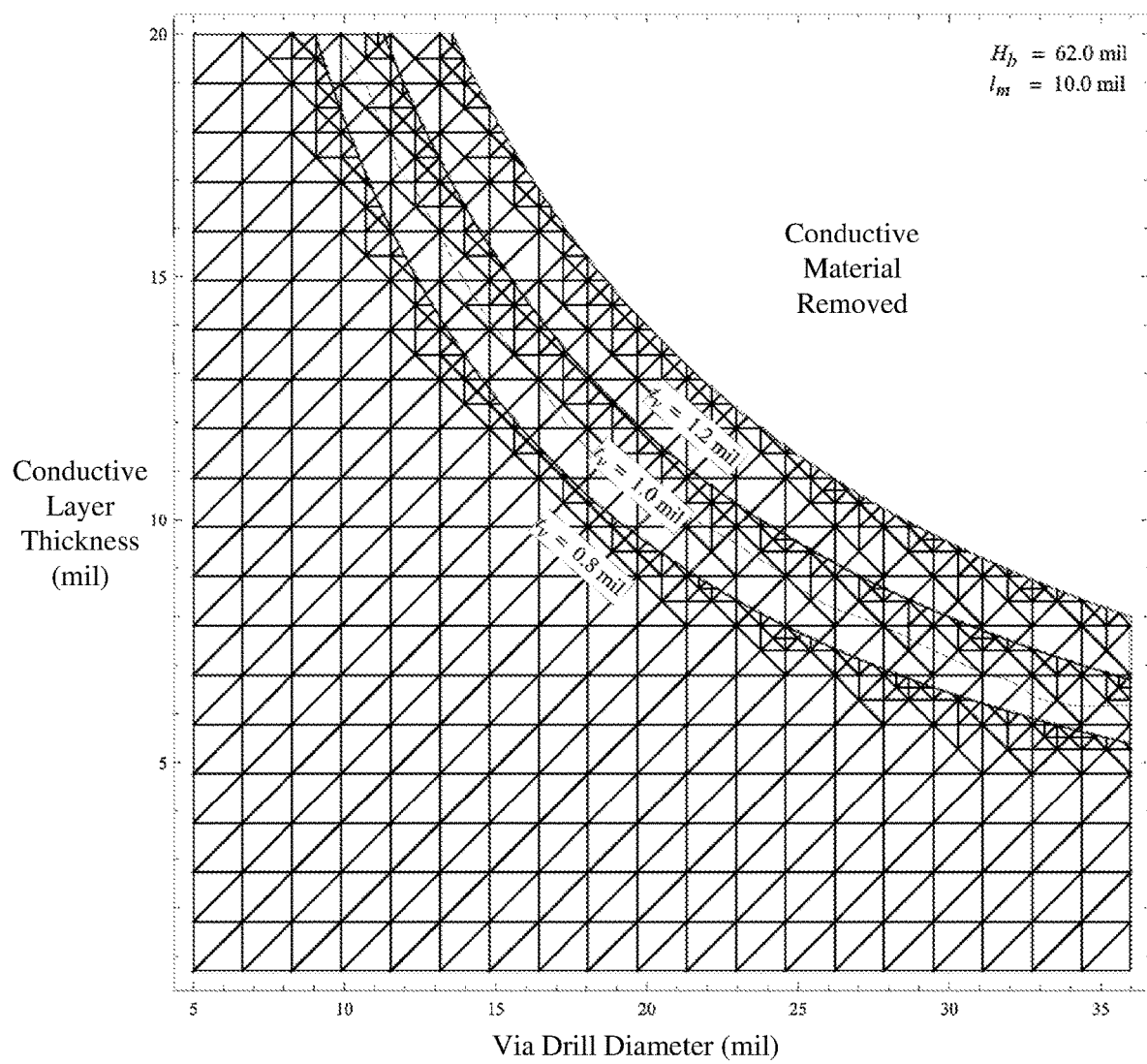
FIG. 12 illustrates a plot of copper layer thickness as a function of via drill diameters and indicates regions in which conductive material is added for various value of via plating thicknesses consistent with embodiments of the present disclosure.

FIG. 12 illustrates a plot of copper layer thickness, $H_c$, as a function of via drill diameters and indicates regions in which conductive material is added for various value of via plating thicknesses, $t_v$, consistent with embodiments of the present disclosure. In various embodiments consistent with the present disclosure, FIG. 12 may provide a reference for determining whether a proposed via drill diameter and thickness of a conductive layer result in an increase or a decrease in the conductive material in a conductive trace as a result of the addition of vias.

Figure 13:
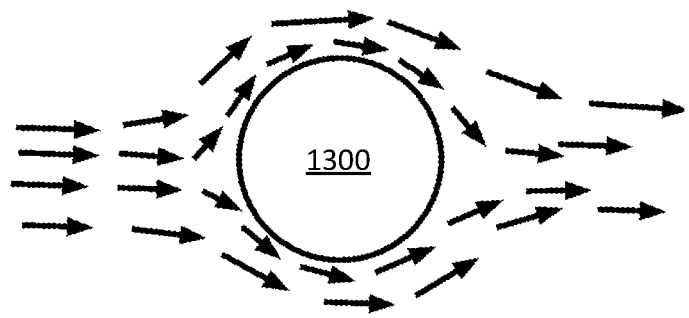
FIG. 13 is a two-dimensional conceptual illustration of a hole in a PCB trace and illustrates a flow of electrical current around the hole consistent with embodiments of the present disclosure.

FIG. 13 is a two-dimensional conceptual illustration of a hole in a PCB trace and illustrates a flow of electrical current around the hole consistent with embodiments of the present disclosure. When the hole is drilled, current on the trace layers is forced to flow around the hole, and thus, increasing electrical resistance. In order to offset, or even reduce the increase in electrical resistance, additional conductive material may be added by increasing the plating in a via.

Figure 14:
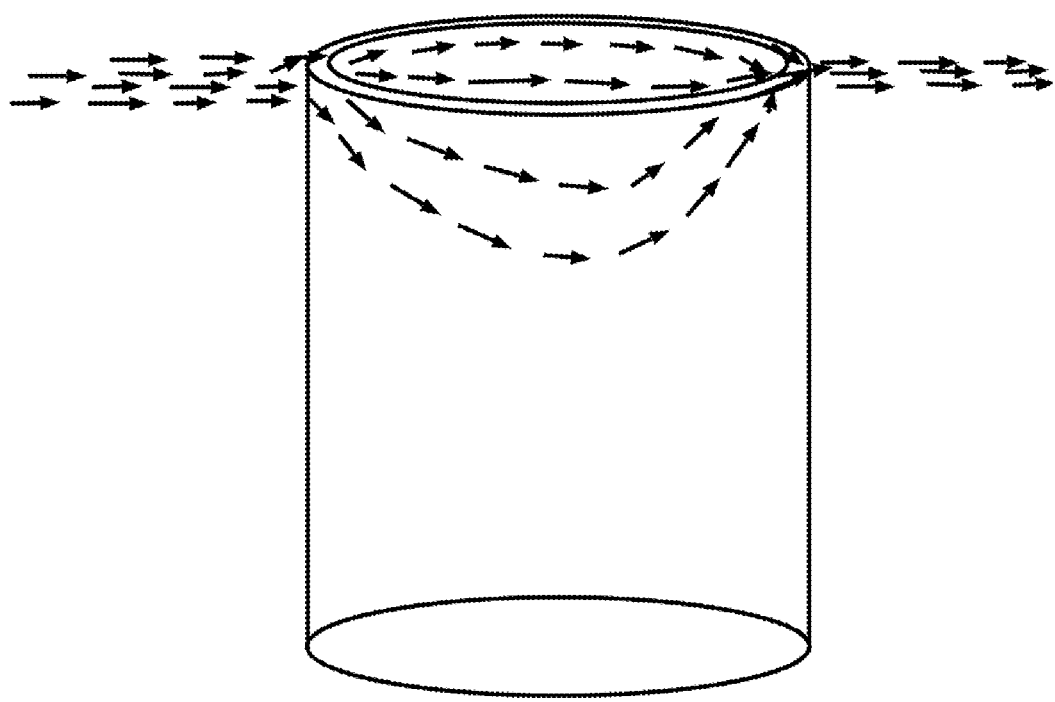
FIG. 14 is a three-dimensional conceptual illustration of a plated via and illustrates a flow of electrical current through the plated via consistent with embodiments of the present disclosure.

FIG. 14 is a three-dimensional conceptual illustration of a plated via and illustrates a flow of electrical current through the plated via consistent with embodiments of the present disclosure. As illustrated in FIG. 14, the plating within the via creates a three-dimensional path through which the current can flow. Provided the via wall is formed of a material with a sufficiently low resistance, the resistance may decrease in comparison to a trace without a via.

Figure 15:
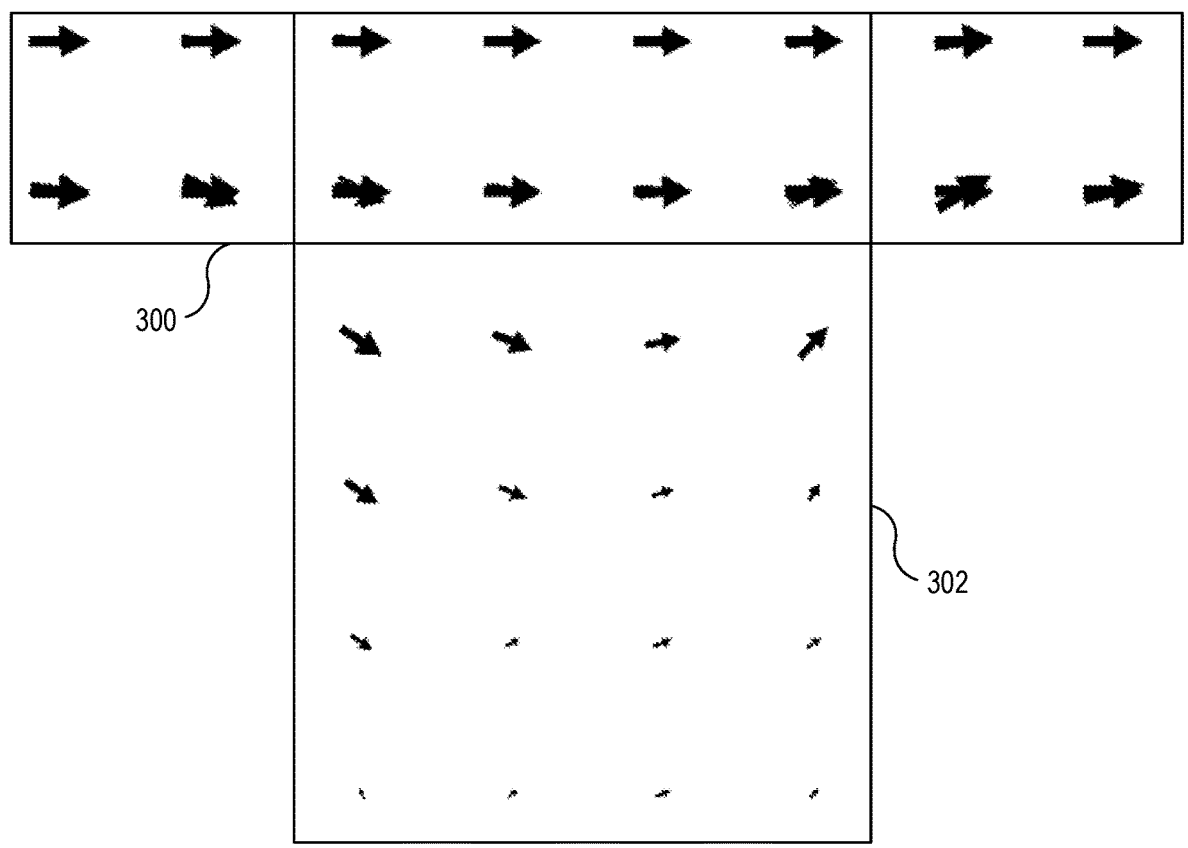
FIG. 15 illustrates a simulation of an electrical current flow through a PCB trace and a plated via consistent with embodiments of the present disclosure.

FIG. 15 illustrates a simulation of an electrical current flow through a PCB trace 300 and a plated via 302 consistent with embodiments of the present disclosure. The magnitude and direction of the current flow at various points is indicated by a plurality of arrows. As illustrated, a portion of the current flows through the via plating. The current flow through the via plating decreases with distance from the PCB trace.

Figure 17:
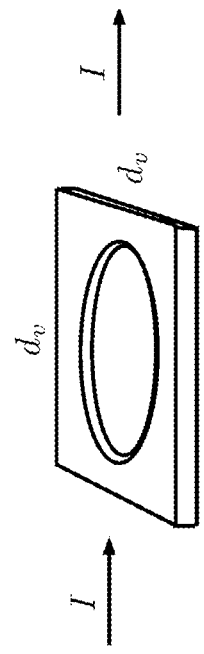
FIG. 17 illustrates the area of FIG. 16 with a via inserted consistent with embodiments of the present disclosure.
Figure 16:
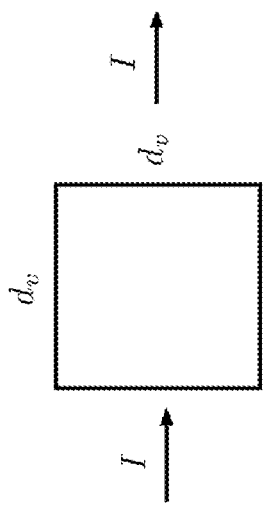
FIG. 16 illustrates an area that exactly encompasses a drill hole of a via consistent with embodiments of the present disclosure.

FIGS. 16, 17, 18, and 19 illustrate a conceptual model of a plated via consistent with embodiments of the present disclosure. FIG. 16 illustrates an area that exactly encompasses a drill hole of a via. An initial step may be to analyze the resistance of the area. FIG. 17 illustrates the area of FIG. 16 with a via inserted. When a via is installed, the via hole first consumes the entire length and width of the box, but the via plating then reduces the hole size as shown in FIG. 17. The next step may be to analyze the resistance of the area after the via is inserted.

Figure 18:
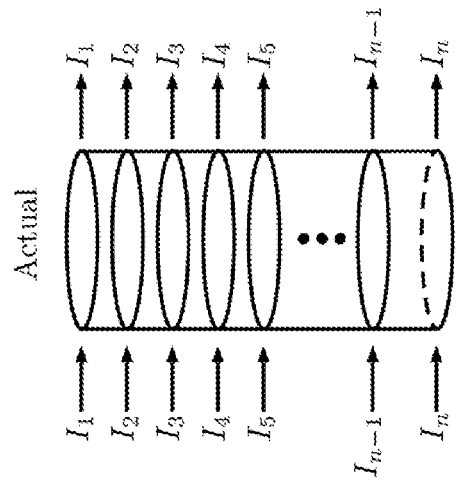
FIG. 18 illustrates a plurality of layers approximating a uniform current injected on the edge of a plated via consistent with embodiments of the present disclosure.

FIG. 18 illustrates a plurality of layers approximating a uniform current injected on the edge of a plated via consistent with embodiments of the present disclosure. Certain simplifying assumptions may be made to reduce the complexity of the geometry of the via. As illustrated, the current is injected into a via at multiple, yet finite points at junctions with the layers, as shown in FIG. 18. Using a large number of layers, or using a small distance between them, the model may be simplified by assuming either an infinite number of layers, or an infinitesimal distance between the layers. In other words, the model may assume that the current is injected uniformly onto the via, as shown in the simplified representation in FIG. 18.

Figure 19:
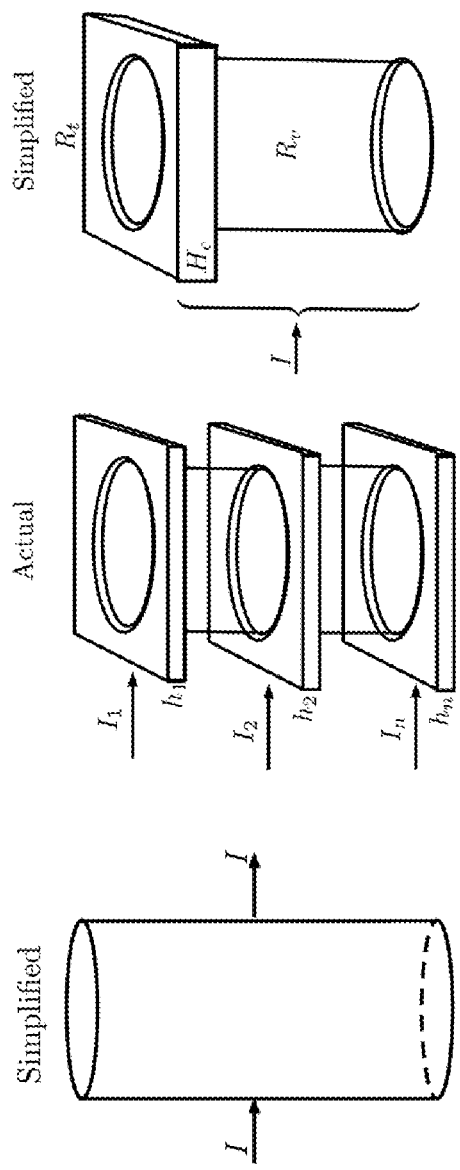
FIG. 19 illustrates a plurality of layers of a conductive trace and a via plating consistent with embodiments of the present disclosure.

FIG. 19 illustrates a plurality of layers of a conductive trace and a via plating consistent with embodiments of the present disclosure. In FIG. 19, the plurality of layers may be combined, and it may be assumed that the current approaches the via plating and cutout uniformly. Notably, the simulation results in FIG. 15 show a divergence from this assumption. Finally, it may be assumed that the resistance of the via plating and the resistance of the trace are a parallel combination of two resistors, $R_v$ and $R_t$.

Figure 20:
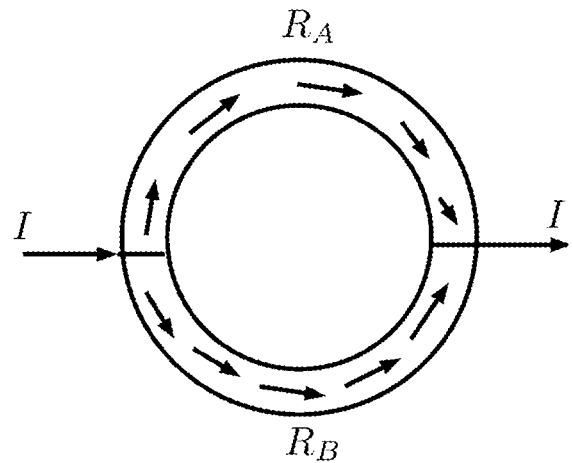
FIG. 20 illustrates a simplified model of a current flowing through a plated via represented as two resistors, each of which represents half of the plated via consistent with embodiments of the present disclosure.

FIG. 20 illustrates a simplified model of a current flowing through a plated via represented as two resistors, each of which represents half of the plated via consistent with embodiments of the present disclosure. The approximate resistance of each semi-cylinder may be represented using Eq. 13.

$$R_A = R_B = \frac{\rho_c \pi d_v}{2 t_v H_c} \quad \text{Eq. 13}$$

The equivalent resistance of $R_A$ and $R_B$ is expressed in Eq. 14.

$$R_v = R_A \| R_b = \frac{1}{2} R_A = \frac{\rho_c \pi d_v}{4 t_v H_c} \quad \text{Eq. 14}$$

Figure 21:
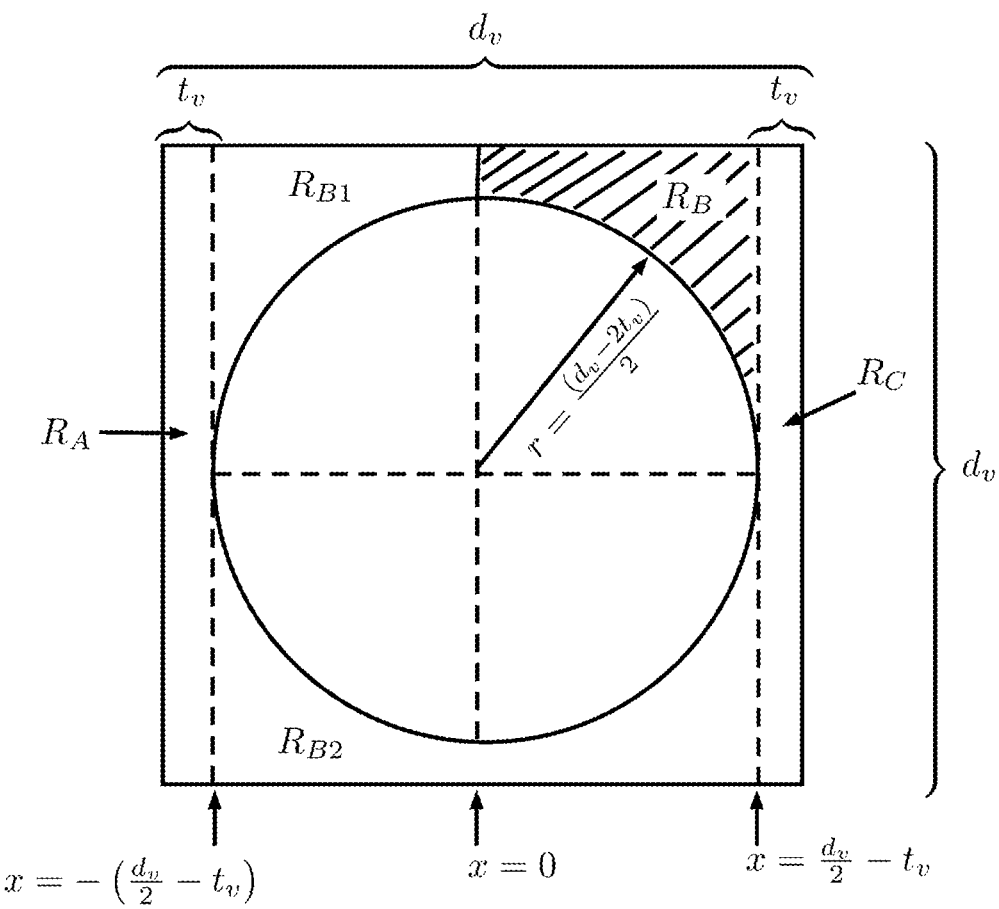
FIG. 21 illustrates a representation of a via cutout including four sections that may be used to determine the resistance of the cutout consistent with embodiments of the present disclosure.

FIG. 21 illustrates a representation of a via cutout including four sections that may be used to determine the resistance of the cutout consistent with embodiments of the present disclosure. As illustrated, the cutout is divided into four regions, namely $R_A$, $R_{B1}$, $R_{B2}$, and $R_C$. The resistance of $R_A$ and $R_C$ may be determined using Eq. 15.

$$R_A = R_C = \frac{\rho_c t_v}{H_c d_v} \quad \text{Eq. 15}$$

The resistance $R_{B1}$ and $R_{B2}$ may be determined as an integral because of the varying cross-sectional area. Specifically, the circle of radius may be substrated from the height of the region. The width of the section at any given position, x may be determined using Eq. 16.

$$w = \frac{d_v}{2} - \sqrt{\left(\frac{d_v - 2t_v}{2}\right)^2 - x^2} \quad \text{Eq. 16}$$

Since $R_{B1} = R_{B2}$ and these sections are in parallel, the effective resistance is simply half of $R_{B1}$. Further, $R_{B1}$ may be divided into two equal sections (i.e., form x=0 to $$x = \frac{d_v}{2} - t_v.$$

Thus, the resistance of only the shaded region in FIG. 21 may be calculated, using Eq. 17.

$$R_B = \int_x^{\frac{d_v}{2} - t_v} \frac{\rho_c}{H_c\left(\frac{d_v}{2} - \sqrt{\left(\frac{d_v - 2t_v}{2}\right)^2 - x^2}\right)} dx \quad \text{Eq. 17}$$

The resistance of the entire cutout may be calculated using Eq. 18.

$$R_t = \frac{\rho_c t_v}{H_c d_v} + \int_x^{\frac{d_v}{2} - t_v} \frac{\rho_c}{H_c\left(\frac{d_v}{2} - \sqrt{\left(\frac{d_v - 2t_v}{2}\right)^2 - x^2}\right)} dx \quad \text{Eq. 18}$$

Finally, since $R_t$ is in parallel with the via wall $R_v$, the resistance of the entire via structure may be calculated using Eq. 19.

$$R_{via} = \frac{1}{\frac{\rho_c t_v}{H_c d_v} + \int_0^{\frac{d_v}{2} - t_v} \frac{\rho_c}{H_c\left(\frac{d_v}{2} - \sqrt{\left(\frac{d_v - 2t_v}{2}\right)^2 - x^2}\right)} dx + \frac{4 t_v H_c}{\rho_c \pi d_v}} \quad \text{Eq. 19}$$

The foregoing analysis may be used to determine an approximate trace resistance including a plurality of vias. The resistance of the square shown in FIG. 16 may be defined using Eq. 20.

$$R_{box} = \frac{\rho_c d_v}{H_c d_v} = \frac{\rho_c}{H_c} \quad \text{Eq. 20}$$

A ratio of via resistance to electrical resistance of the original trace may be defined using Eq. 21.

$$\alpha = \frac{R_{via}}{\frac{\rho_c}{H_c}} \quad \text{Eq. 21}$$

Combining and simplifying Eq. 21 with Eq. 19 yields Eq. 22.

$$\alpha = \frac{H_c}{\frac{1}{\frac{\rho_c t_v}{H_c d_v} + \int_0^{\frac{d_v}{2} - t_v} \frac{\rho_c}{H_c\left(\frac{d_v}{2} - \sqrt{\left(\frac{d_v - 2t_v}{2}\right)^2 - x^2}\right)} dx + \frac{4 t_v H_c}{\rho_c \pi d_v}}} \quad \text{Eq. 22}$$

Eq. 22 represents a percent change in resistance when a via is inserted.

Figure 22:
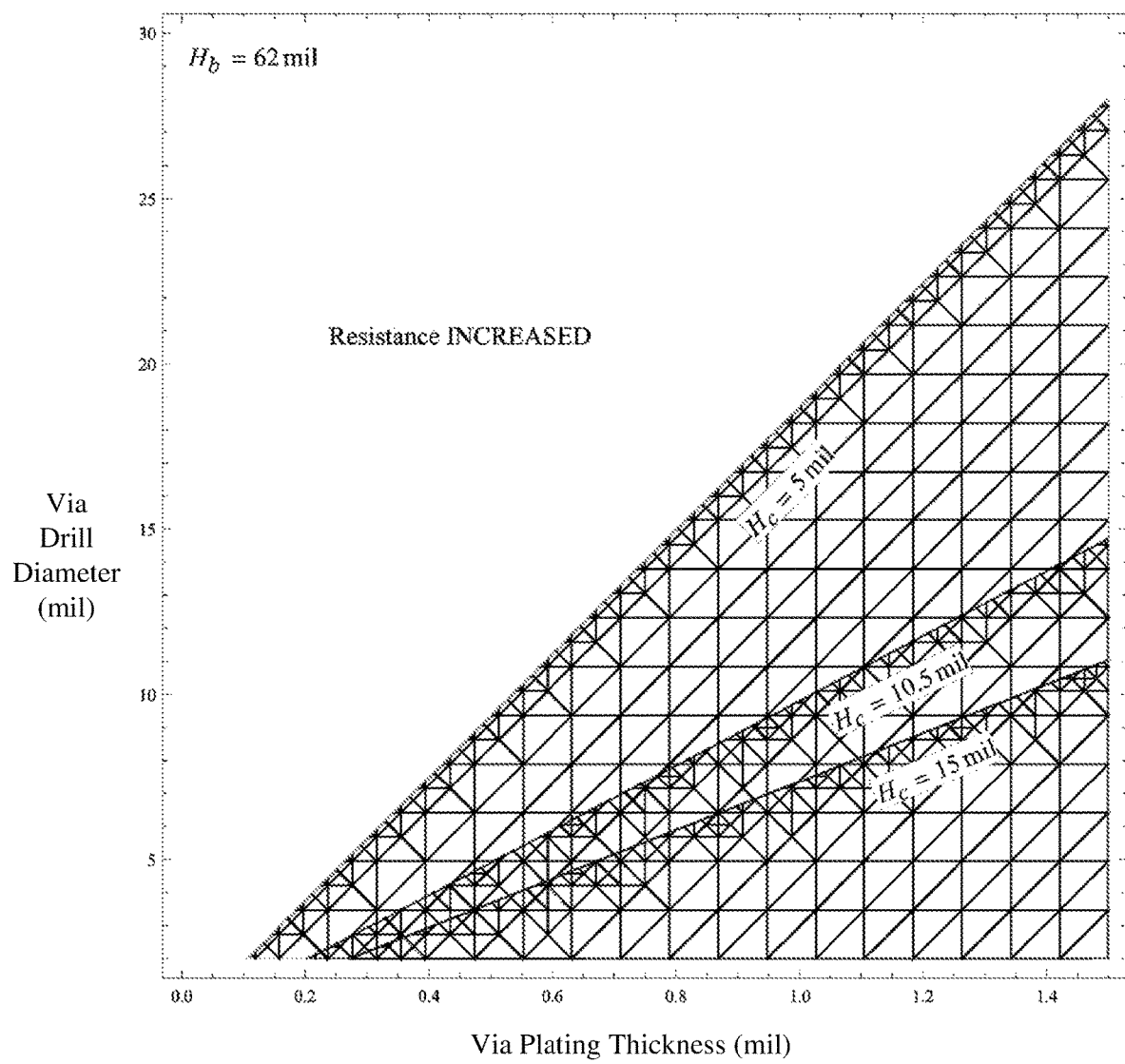
FIG. 22 illustrates a plot of a via drill diameter as a function of via plating thickness and indicates regions in which electrical resistance is reduced by the addition of vias for various value of conductive material, $H_c$, consistent with embodiments of the present disclosure.

FIG. 22 illustrates a plot of a via drill diameter as a function of via plating thickness and indicates regions in which electrical resistance is reduced by the addition of vias for various value of conductive material, $H_c$, consistent with embodiments of the present disclosure. FIG. 22 also identifies regions in which electrical resistance is increased as a result of vias.

A change in trace resistance may be estimated for a given number of vias inserted. For a trace of length L and width W, the entire trace may be divided into n boxes having an dimension $d_v \times d_v$. The number of boxes in the trace may be determined using Eq. 23.

$$n_{boxes} = \frac{LW}{d_v^2} \qquad \text{Eq. 23}$$

The resistance of the trace may be determined using Eq. 24.

$$R_{trace} = \frac{\rho_c L}{H_c W} \qquad \text{Eq. 24}$$

When a via is punched into the trace, the added via may change the resistance of an associated box by a factor $\alpha$; however, the resistance of the entire trace does not change by a unless a via is added to every box. As such, Eq. 25 and Eq. 26 may describe boundary conditions of this approximation.

$$R_{trace}(n=0) = \frac{\rho_c L}{H_c W} \qquad \text{Eq. 25}$$

$$R_{trace}\left(n = \frac{LW}{d_v^2}\right) = \alpha \frac{\rho_c L}{H_c W}. \qquad \text{Eq. 26}$$

Eq. 27 satisfies both conditions with a linear interpolation between.

$$R_{trace}(n) = \frac{\rho_c L}{H_c W}\left(1 - (1-\alpha)\frac{nd_v^2}{LW}\right) \qquad \text{Eq. 27}$$

The trace resistance is a function of the number of vias in the trace as well as of $\alpha$. Instead of the via removing conductive material, which may be replaced with more or less than has been removed by plating, the traces may be connected through the via with solder, and the solder may behave as a thick via wall.

Figure 23:
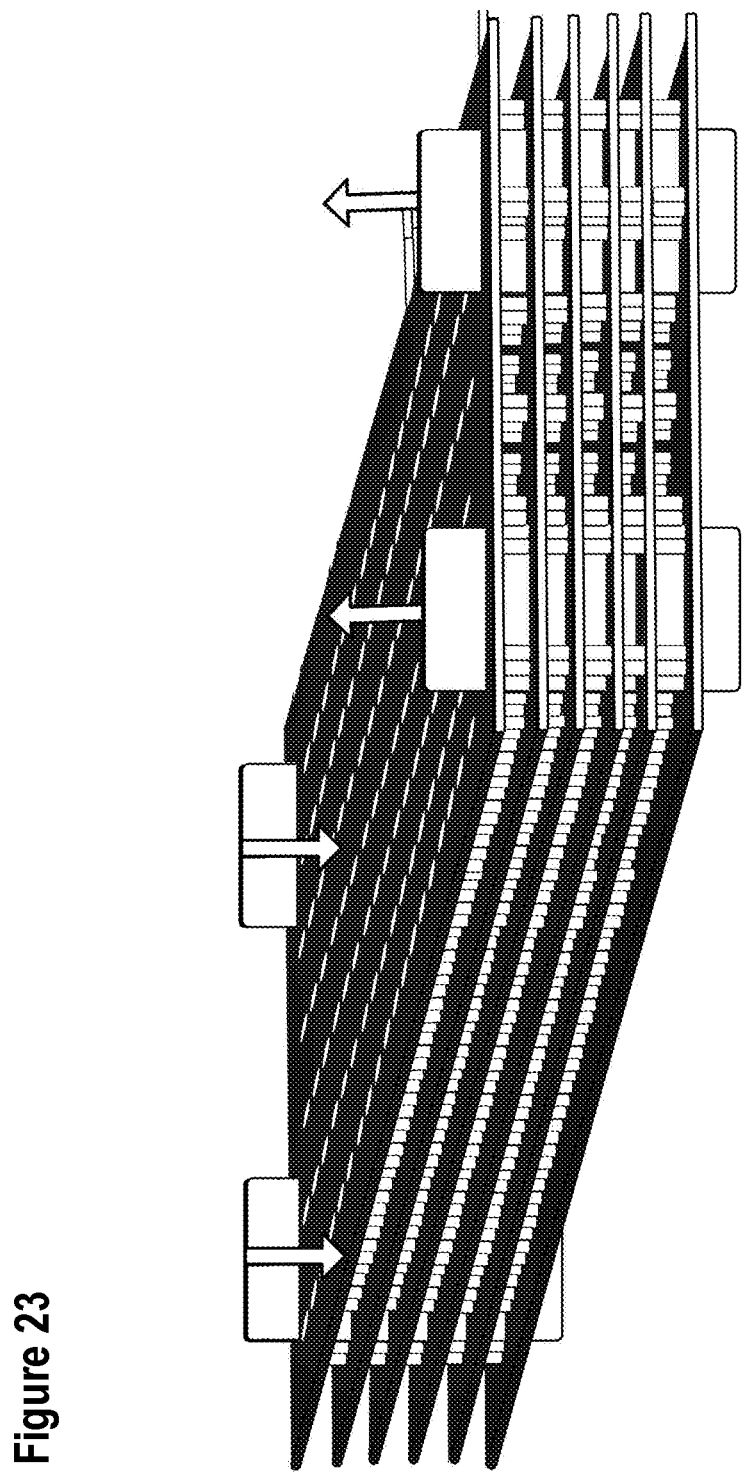
FIG. 23 illustrates a representation of a simulation model used to verify the accuracy of estimates presented herein for assessing the change in electrical resistance associated with the addition of a plurality of vias to a conductive trace consistent with embodiments of the present disclosure.

FIG. 23 illustrates a representation of a simulation model used to verify the accuracy of estimates presented herein for assessing the change in electrical resistance associated with the addition of a plurality of vias to a conductive trace consistent with embodiments of the present disclosure. In a simulation, currents of 250 A were injected into each of the two connections on the trace, for a total of 500 A. The simulation calculated the static loss power. The resistance was calculated based on the current.

Figure 24:
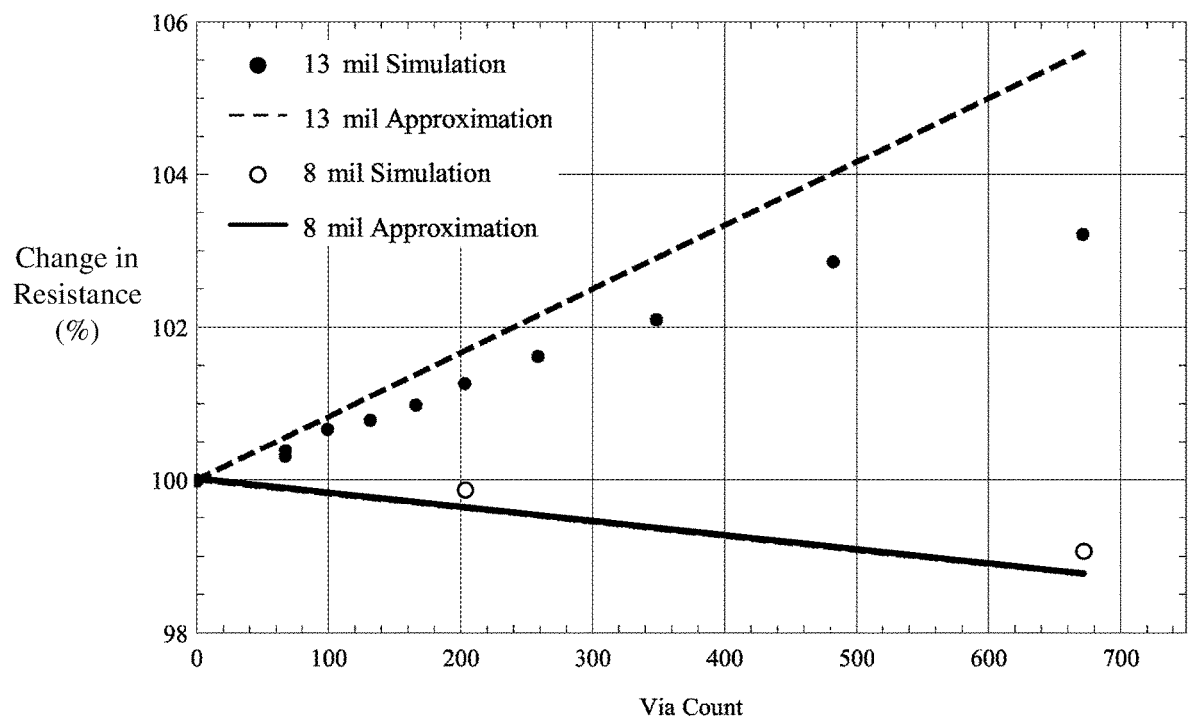
FIG. 24 illustrates a plot of a change in resistance as a function of via count for two scenarios of approximated values and simulation results consistent with embodiments of the present disclosure.

FIG. 24 illustrates a plot of a change in resistance as a function of via count for two scenarios of approximated values and simulation results consistent with embodiments of the present disclosure. The accuracy of the estimates reflected in Eq. 27 may be verified using the simulation model shown in FIG. 23, using two alpha (a) factors, as shown in Eq. 28 and Eq. 29.

$$\alpha(d_v=13 \text{ mil}, t_v=1 \text{ mil})=1.2945 \qquad \text{Eq. 28}$$

$$\alpha(d_v=8 \text{ mil}, t_v=1 \text{ mil})=0.827357 \qquad \text{Eq. 29}$$

While there is some difference between the simulation points and the approximation, the direction of change in resistance is consistent.

Figure 25:
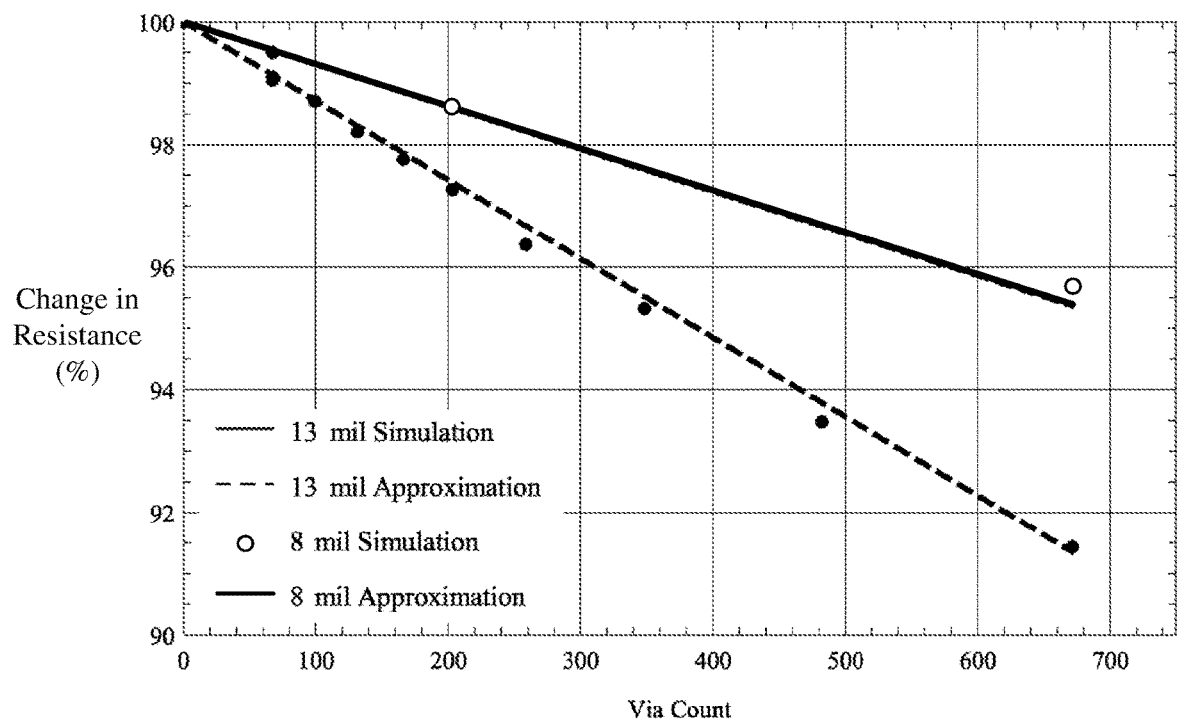
FIG. 25 illustrates a plot of a change in resistance as a function of via count for two scenarios of approximated values and simulation results consistent with embodiments of the present disclosure.

FIG. 25 illustrates a plot of a change in resistance as a function of via count for two scenarios of approximated values and simulation results consistent with embodiments of the present disclosure. A greater decrease in resistance may be achieved by increasing the wall thickness, $t_v$, to 2.54 mil. The results in FIG. 25 show the results of the simulation model shown in FIG. 23, and two alpha ($\alpha$) factors, as shown in Eq. 30 and Eq. 31.

$$\alpha(d_v=13 \text{ mil}, t_v=2.54 \text{ mil})=0.827357 \qquad \text{Eq. 30}$$

$$\alpha(d_v=8 \text{ mil}, t_v=2.54 \text{ mil})=0.3508435 \qquad \text{Eq. 31}$$

The previous analysis assumes the vias are filled with air. This is in many respects a "worst case" analysis since at least some vias will typically be filled with solder. If solder-filling is taken into account, the method of populating a trace with many vias becomes even more effective at improving CCC.

Figure 26:
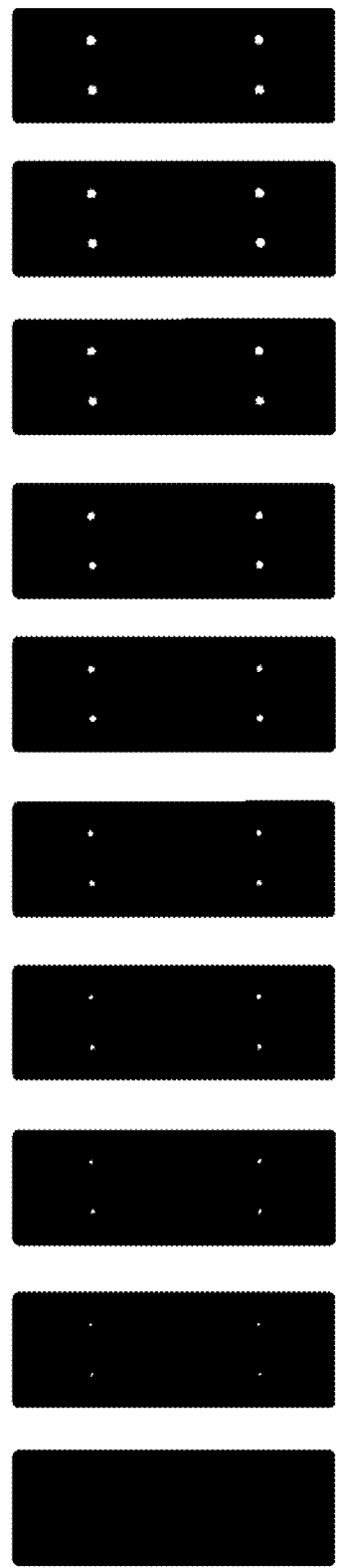
FIG. 26 illustrates a module of a PCB trace comprising a plurality of solder-filled vias consistent with embodiments of the present disclosure.
Figure 27:
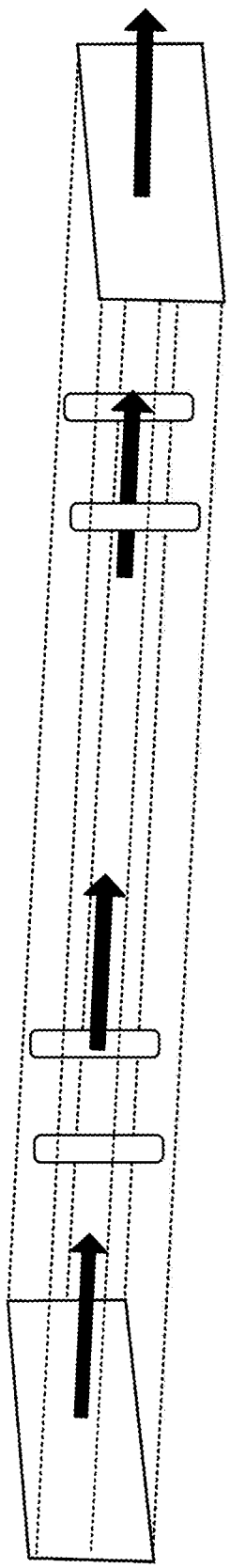
FIG. 27 illustrates a model that may be used to simulate variable size solder-filled vias consistent with embodiments of the present disclosure.

FIG. 26 illustrates a module of a PCB trace comprising a plurality of solder-filled vias consistent with embodiments of the present disclosure. FIG. 27 illustrates a model that may be used to simulate variable size solder-filled vias consistent with embodiments of the present disclosure. It may be difficult to ensure solder-filled vias using typical PCB manufacturing techniques. Accordingly, an analysis of air-filled vias may be considered.

Figure 28:
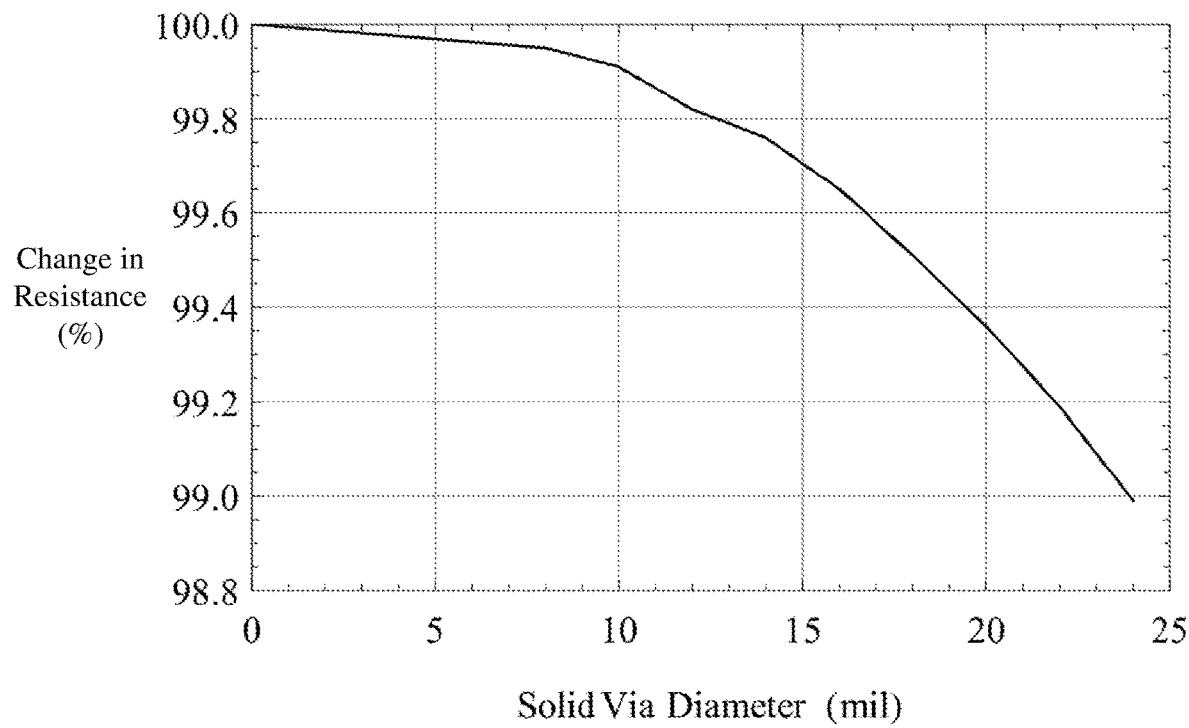
FIG. 28 illustrates a change in electrical resistance as a function of a via diameter that is filled with solder consistent with embodiments of the present disclosure.

FIG. 28 illustrates a change in electrical resistance as a function of a via diameter that is filled with solder consistent with embodiments of the present disclosure. While hollow vias generally have worse performance (higher resistance and less copper volume) for larger hole sizes, solid vias perform significantly better as the via diameter increases. If there is some confidence in solder filling, a designer may opt to use larger vias to decrease the electrical resistance.

Adding vias to a conductive trace may alter the electrical properties of the trace by changing the amount of conductive materials in the trace and by changing the electrical resistance of the trace. These two effects may improve the thermal behavior of a conductive trace. A thermal analysis may begin by calculating the temperature rise in the conductive element using Eq. 32. In this example, the conductive element is copper.

$$\Delta T = \frac{P_D}{M_c C} \qquad \text{Eq. 32}$$

In Eq. 32, C is the heat capacity of copper, $M_c$ is the mass of copper in the trace, and $P_D$ is the power dissipated.

To begin, we calculate the temperature rise. The change in temperature may also be determined using Eq. 33.

$$\Delta T = \frac{I^2 R_{trace}}{d_c V_t C} \qquad \text{Eq. 33}$$

In Eq. 33, $d_c$ is the density of copper and $V_t$ is the volume of copper in the trace. The resistance of the trace is provided in Eq. 27. Substituting Eq. 27 into Eq. 33 yields Eq. 34.

$$\Delta T = \frac{I^2 \left[ \frac{\rho_c L}{H_c W} \left(1 - (1-\alpha)\frac{nd_v^2}{LW}\right)\right]}{d_c V_t C} \quad \text{Eq. 34}$$

The term $V_t$ in Eq. 34 may be substituted with an expression representing the volume of copper (i.e., the product of the length (L), width (W), conductive material ($H_c$), the trace, the net change in conductive material for a single via, $V_{c,(1via)}$, and the number of vias (n), as shown in Eq. 35.

$$\Delta T = \frac{I^2 \left[ \frac{\rho_c L}{H_c W} \left(1 - (1-\alpha)\frac{nd_v^2}{LW}\right)\right]}{d_c (LWH_c)V_{c,(1via)} nC} \quad \text{Eq. 35}$$

Then Equation 5 can be substituted for $V_{c,(1via)}$ in Eq. 35. Calculating the temperature rise using the trace parameters of the proto board of FIG. 4 gives FIG. 30.

Figure 29:
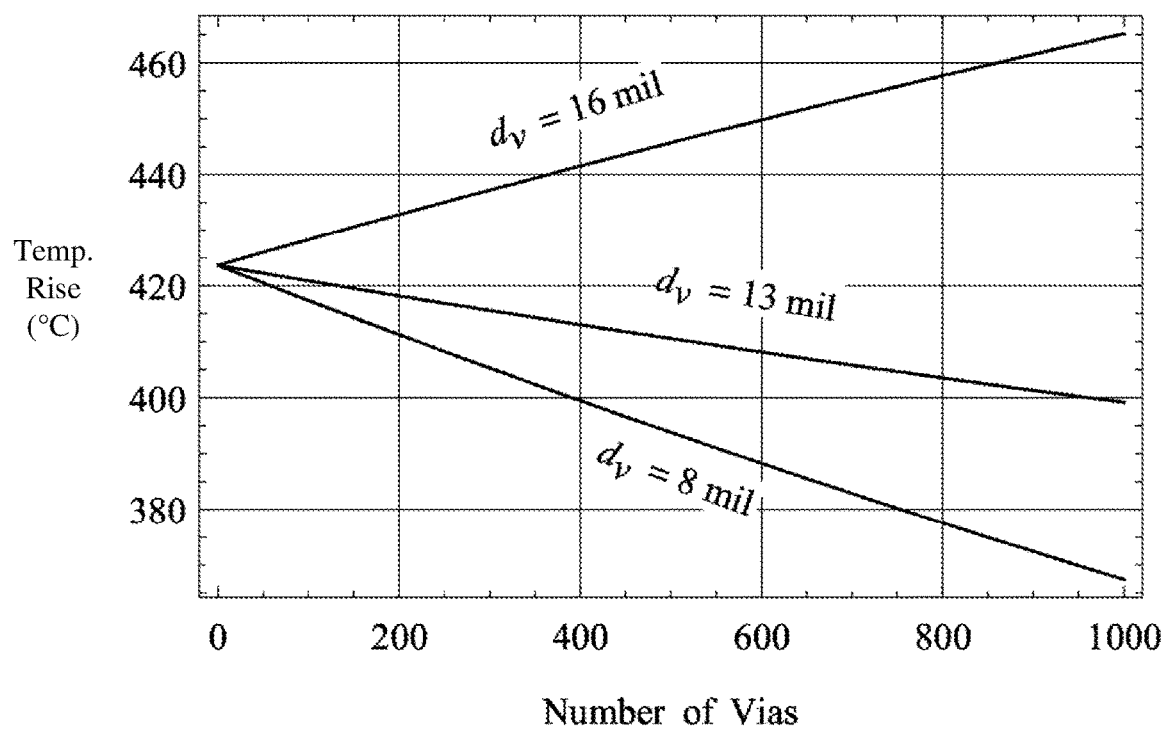
FIG. 29 illustrates a temperature rise of a conductive trace as a function of the number of vias in the trace consistent with embodiments of the present disclosure.
Figure 30:
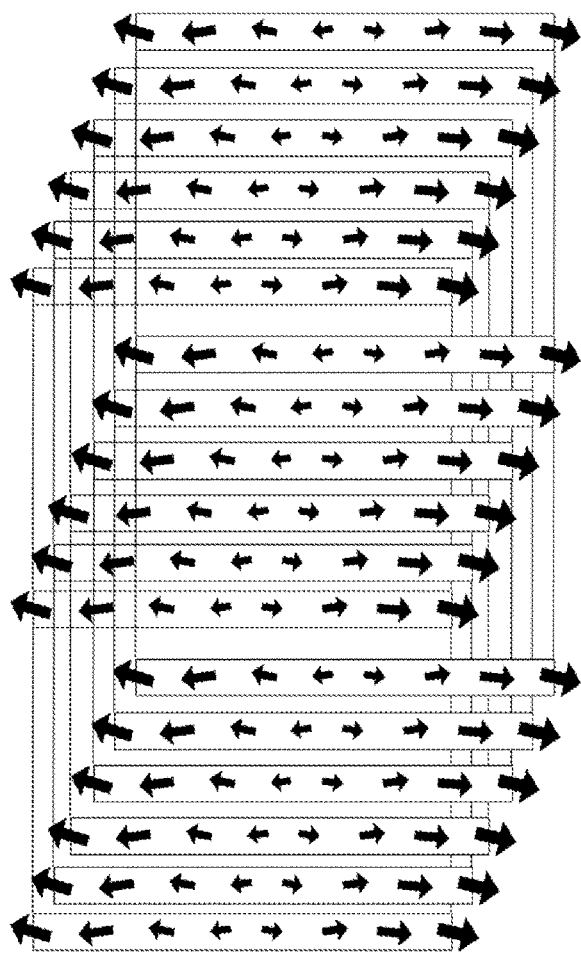
FIG. 30 illustrates a simulation of a multilayer current-carrying trace with a plurality of vias that provide thermally conductive paths consistent with embodiments of the present disclosure.

FIG. 29 illustrates a temperature rise of a conductive trace as a function of the number of vias in the trace consistent with embodiments of the present disclosure. As shown in FIG. 24, the electrical resistance of the trace increases for a 13 mil via; however, as shown in FIG. 30, the overall temp rise of the trace rise is reduced. For 8 mil vias, the reduction in temperature is improved. The addition of 16 mil vias, on the other hand, increases resistance and the temperature rise.

Figure 31:
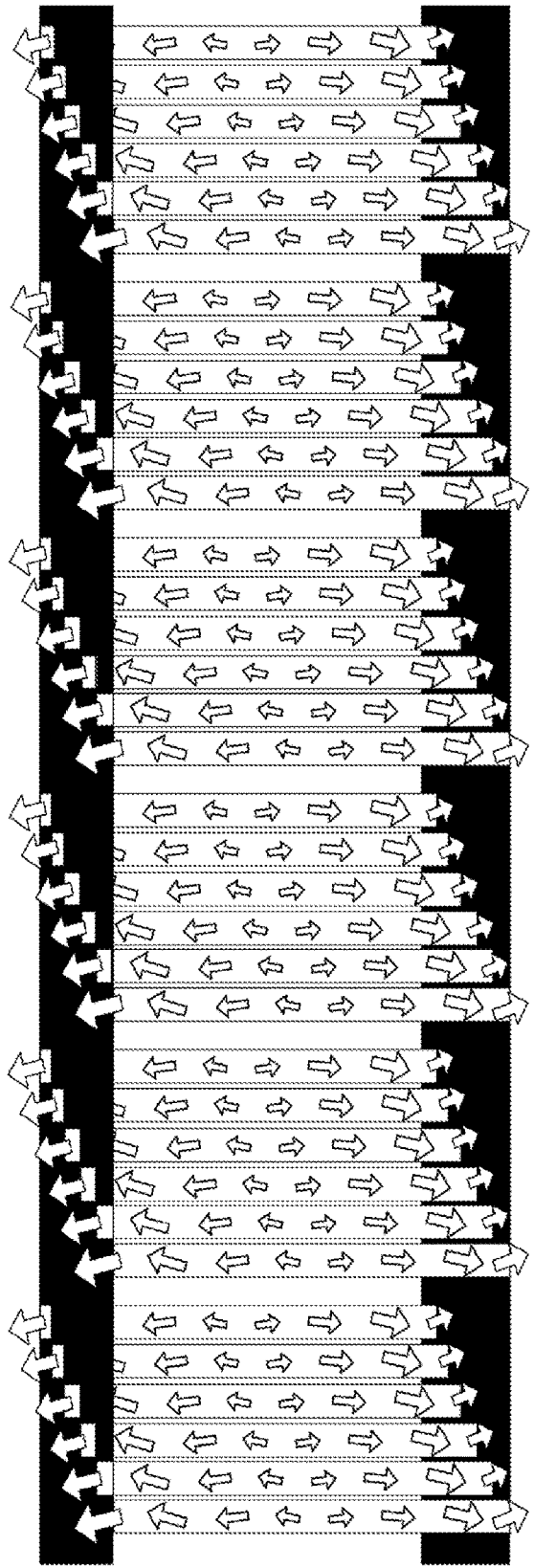
FIG. 31 illustrates a simulation of a multilayer current-carrying trace with a plurality of vias that provide thermally conductive paths consistent with embodiments of the present disclosure.

FIGS. 30 and 31 illustrate simulations of a multilayer current-carrying trace with a plurality of vias that provide thermally conductive paths consistent with embodiments of the present disclosure. The direction and magnitude of heat flow is illustrated with arrows, which indicate that heat flows away from the inner-most layer to the outer-most layers.

Figure 32:
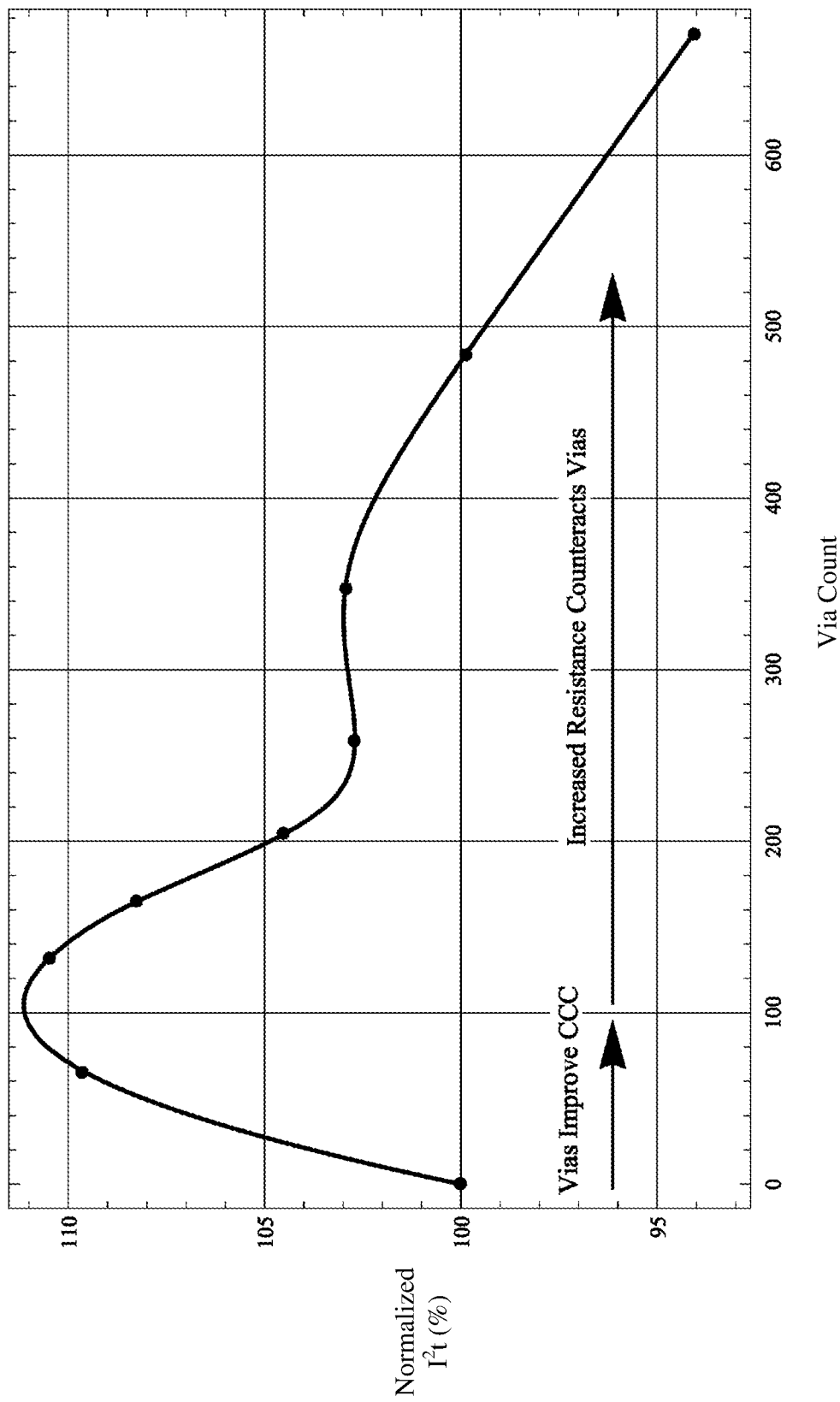
FIG. 32 illustrates a plot of a normalized fusing measurement as a function of a number of vias in a conductive trace consistent with embodiments of the present disclosure.

FIG. 32 illustrates a plot of a normalized fusing measurement as a function of a number of vias in a conductive trace consistent with embodiments of the present disclosure. The illustrated results were obtained by inducing large currents in electrical traces having varying numbers of vias and measuring the voltage across the trace. The test scenario illustrated in FIG. 32 used dimensions where electrical resistance increases as more vias are added. The results show that adding vias up to a certain threshold provides thermal benefits resulting in an improved fusing rating. The addition of vias beyond the threshold increases the electrical heating and therefore negates the thermal benefits provided by the vias. The illustrated results depict air-filled vias. If the vias are filled with solder, the resistance of these vias decreases, providing both improved thermal performance and decreased electrical resistance. Fusing occurs when the current source reaches a compliance voltage limit.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A multilayer printed circuit board comprising:
   a high current-carrying conductive trace disposed on a plurality of layers in the multilayer circuit;
   a current port in communication with the high current-carrying conductive trace;
   a plurality of thermal vias in thermal communication with the conductive trace and extending through at least a portion of the plurality of layers, the plurality of thermal vias configured to control:
      an electrical resistance of the conductive trace, and
      a thermal response of the conductive trace;
   wherein the electrical resistance of the high current-carrying conductive trace and the thermal response of the conductive trace provide a current carrying capacity of five hundred amperes for one second.

2. The multilayer printed circuit board of claim 1, wherein the plurality of thermal vias are configured to decrease heating of the conductive trace caused by electrical current flow.

3. The multilayer printed circuit board of claim 1, wherein the plurality of thermal vias comprise solder-filled vias.

4. The multilayer printed circuit board of claim 1, wherein the thermal vias each comprise a diameter and a plating thickness selected to add a quantity of conductive material to the conductive trace.

5. The multilayer printed circuit board of claim 1, wherein the number of vias maximizes a fusing measurement of the conductive trace.

6. The multilayer printed circuit board of claim 1, wherein the number of vias decreases the electrical resistance of the conductive trace.

7. The multilayer printed circuit board of claim 1, wherein the vias are placed in proximity to the current port to improve solderability of the conductive trace.

8. The multilayer printed circuit board of claim 1, wherein the plurality of vias comprise a diameter of approximately 5 mil.

9. The multilayer printed circuit board of claim 1, wherein a diameter of the plurality of vias is approximately equal to $$\frac{2(H_b l_m t_v + 2 H_b t_v^2)}{H_c l_m + 2 H_b t_v},$$

where:
   $H_b$ is a thickness of the conductive layers of the printed multilayer circuit board,
   $l_m$ is a distance between adjacent vias, and
   $t_v$ is a plating thickness.

10. A high-current capacity multilayer printed circuit board to interface an intelligent electronic device (IED) with an electric power system, the multilayer printed circuit board comprising:
   a high current current-carrying conductive trace disposed on a plurality of layers in the multilayer circuit;
   a current port in communication with the current-carrying conductive trace;
   a plurality of thermal vias in thermal communication with the conductive trace and extending through at least a portion of the plurality of layers, the plurality of thermal vias configured to control:
      an electrical resistance of the conductive trace, and
      a thermal response of the conductive trace;
   wherein the electrical resistance of the conductive trace and the thermal response of the conductive trace are controlled by a via diameter and a plating thickness and the via diameter and plating thickness are selected to accommodate a target current-carrying capacity.

11. The high-current capacity multilayer printed circuit board of claim 10, wherein the target current capacity comprises a range from a nominal current of five amperes to a current spike of five hundred amperes.

12. The high-current capacity multilayer printed circuit board of claim 10, wherein the diameter of the plurality of vias is approximately equal to $$\frac{2(H_b l_m t_v + 2H_b t_v^2)}{H_c l_m + 2H_b t_v},$$

where:
- $H_b$ is a thickness of the conductive layers of the printed multilayer circuit board,
- $l_m$ is a distance between adjacent vias, and
- $t_v$ is the plating thickness.

* * * * *